US009621775B2

(12) United States Patent
Ng et al.

(10) Patent No.: US 9,621,775 B2
(45) Date of Patent: Apr. 11, 2017

(54) ELECTRICAL BAR LATCHING FOR LOW STIFFNESS FLEXURE MEMS ACTUATOR

(71) Applicant: MEMS DRIVE, INC., Arcadia, CA (US)

(72) Inventors: Matthew Ng, Rosemead, CA (US); Roman Gutierrez, Arcadia, CA (US); Guiqin Wang, Arcadia, CA (US)

(73) Assignee: MEMS Drive, Inc., Arcadia, CA (US)

( * ) Notice: Subject to any disclaimer, the term of this patent is extended or adjusted under 35 U.S.C. 154(b) by 0 days.

(21) Appl. No.: 14/819,413

(22) Filed: Aug. 5, 2015

(65) Prior Publication Data

US 2015/0341534 A1 Nov. 26, 2015

Related U.S. Application Data

(63) Continuation-in-part of application No. 14/677,730, filed on Apr. 2, 2015.
(Continued)

(51) Int. Cl.
*H02N 1/00* (2006.01)
*H04N 5/222* (2006.01)
(Continued)

(52) U.S. Cl.
CPC ............ *H04N 5/2254* (2013.01); *B81B 3/007* (2013.01); *H02N 1/008* (2013.01); *H04N 5/225* (2013.01);
(Continued)

(58) Field of Classification Search
CPC ...... H04N 5/2254; H04N 5/225; H04N 5/335; H04N 5/2328; B81B 3/007;
(Continued)

(56) References Cited

U.S. PATENT DOCUMENTS 5,310,157 A 5/1994 Platus
5,475,318 A 12/1995 Marcus et al.
(Continued)

OTHER PUBLICATIONS

Horsley, D. et al., Microfabricated Electrostatic Actuators for Hard Disk Drives, IEEE/ASME 1-22 Transactions on Mechatronics, Sep. 1998, pp. 1-9, vol. 3, No. 3.
(Continued)

*Primary Examiner* — Nicholas Giles
(74) *Attorney, Agent, or Firm* — Brian J. Colandreo; Michael T. Abramson; Holland & Knight LLP

(57) ABSTRACT

A MEMS actuator including buckled flexures and a method of assembling the actuator are described. The assembled MEMS actuator includes an inner frame; an outer frame including latched electrical bars, where a first of the latched bars includes a latch protrusion secured to a corresponding latch groove of a second of the latched bars; and buckled flexures coupling the inner frame to the outer frame. The flexures are buckled during assembly of the MEMS actuator by incorporating the electrical bar latching mechanism into the design of the outer frame of the MEMS actuator. In one implementation, the MEMS actuator is assembled by providing a MEMS actuator with unbuckled flexures coupling the outer frame of the MEMS actuator to an inner frame of the MEMS actuator, where the outer frame includes unlatched electrical bars, and latching the electrical bars of the outer frame, resulting in buckled flexures.

16 Claims, 27 Drawing Sheets

Related U.S. Application Data

(60) Provisional application No. 61/989,457, filed on May 6, 2014.

(51) Int. Cl.
*H04N 5/225* (2006.01)
*H04N 5/335* (2011.01)
*B81B 3/00* (2006.01)

(52) U.S. Cl.
CPC ...... *H04N 5/335* (2013.01); *B81B 2203/0163* (2013.01); *B81B 2207/07* (2013.01); *Y10T 29/49107* (2015.01)

(58) Field of Classification Search
CPC ........ B81B 2203/0163; B81B 2207/07; H02N 1/008; G03B 2205/0007
See application file for complete search history.

(56) References Cited

U.S. PATENT DOCUMENTS

| | | | | |
|---|---|---|---|---|
| 5,536,988 | A * | 7/1996 | Zhang | B81B 3/0021 310/309 |
| 5,794,909 | A | 8/1998 | Platus et al. | |
| 6,275,325 | B1 | 8/2001 | Sinclair | |
| 7,489,340 | B2 * | 2/2009 | Koo | G02B 13/001 348/208.7 |
| 7,923,894 | B2 * | 4/2011 | Obi | B81B 3/007 310/309 |
| 8,138,564 | B2 * | 3/2012 | Kosaka | H04N 5/2257 257/414 |
| 8,711,495 | B2 * | 4/2014 | Topliss | G02B 7/08 359/298 |
| 8,836,096 | B2 * | 9/2014 | Kosaka | H04N 5/2257 257/114 |
| 8,855,476 | B2 * | 10/2014 | Liu | G02B 26/0841 348/208.11 |
| 8,970,781 | B2 * | 3/2015 | Ryou | G02B 7/08 348/208.7 |
| 2006/0092514 | A1 * | 5/2006 | Koo | G02B 13/001 359/557 |
| 2006/0110108 | A1 * | 5/2006 | Hsieh | G02B 6/422 385/92 |
| 2007/0002159 | A1 * | 1/2007 | Olsen | G02B 7/04 348/335 |
| 2007/0091415 | A1 * | 4/2007 | Tsuboi | B81B 3/0078 359/291 |
| 2008/0017942 | A1 * | 1/2008 | Kosaka | H04N 5/2257 257/432 |
| 2011/0141342 | A1 * | 6/2011 | Ming | G02B 7/08 348/345 |
| 2012/0081598 | A1 * | 4/2012 | Calvet | B81B 3/0037 348/357 |
| 2012/0119614 | A1 * | 5/2012 | Gutierrez | G02B 7/102 310/300 |
| 2012/0146171 | A1 * | 6/2012 | Kosaka | H04N 5/2257 257/432 |
| 2012/0242363 | A1 | 9/2012 | Breinlinger et al. | |
| 2013/0057757 | A1 * | 3/2013 | Ryou | G02B 7/08 348/374 |
| 2013/0076919 | A1 * | 3/2013 | Gutierrez | G02B 27/646 348/208.2 |
| 2013/0077945 | A1 * | 3/2013 | Liu | G02B 26/0841 396/55 |
| 2014/0048240 | A1 | 2/2014 | Platus | |

OTHER PUBLICATIONS

Patent Cooperation Treaty, International Search Report for PCT/US2015/024161, Jul. 2, 2015, pp. 1-2.

* cited by examiner

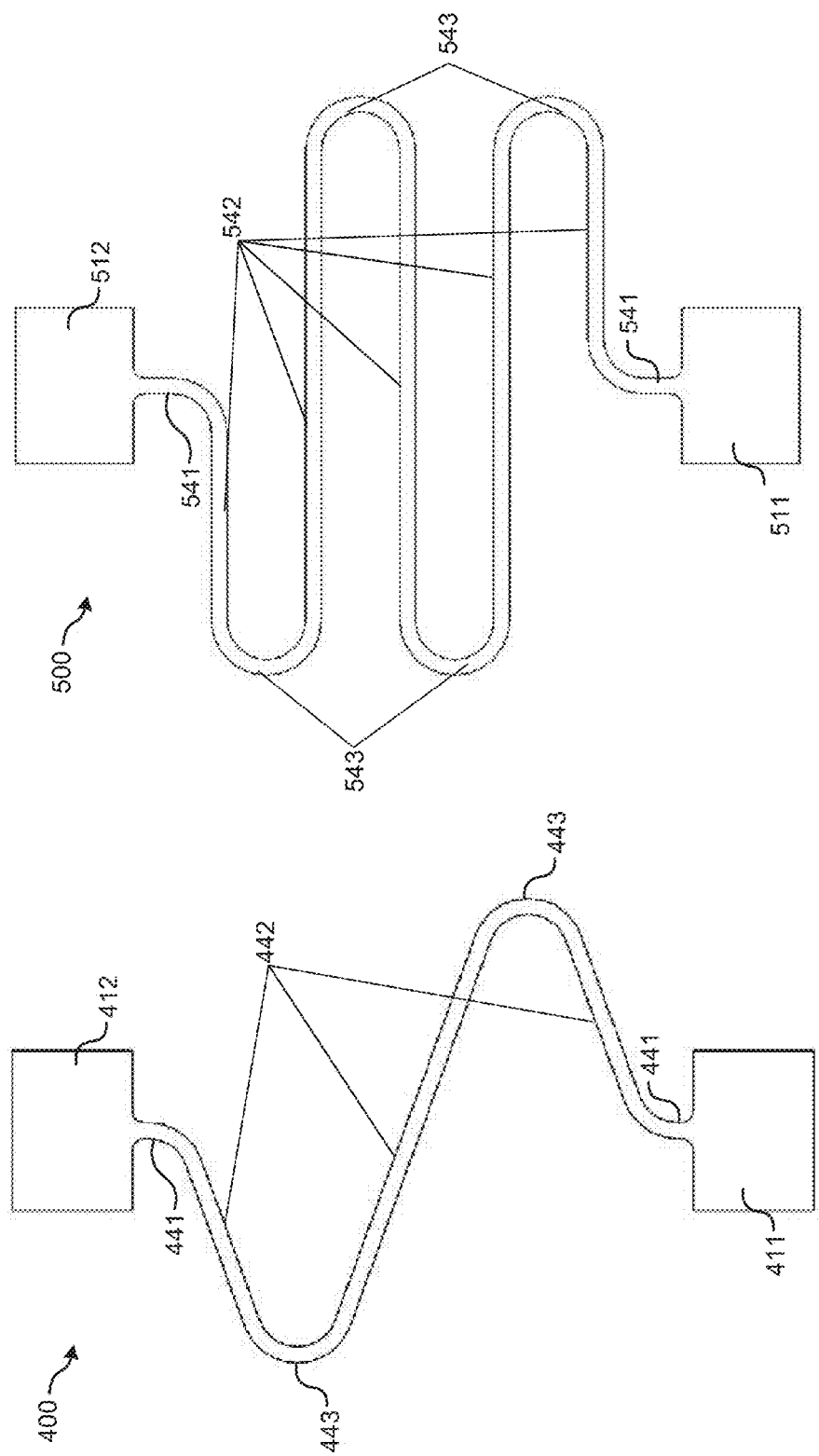

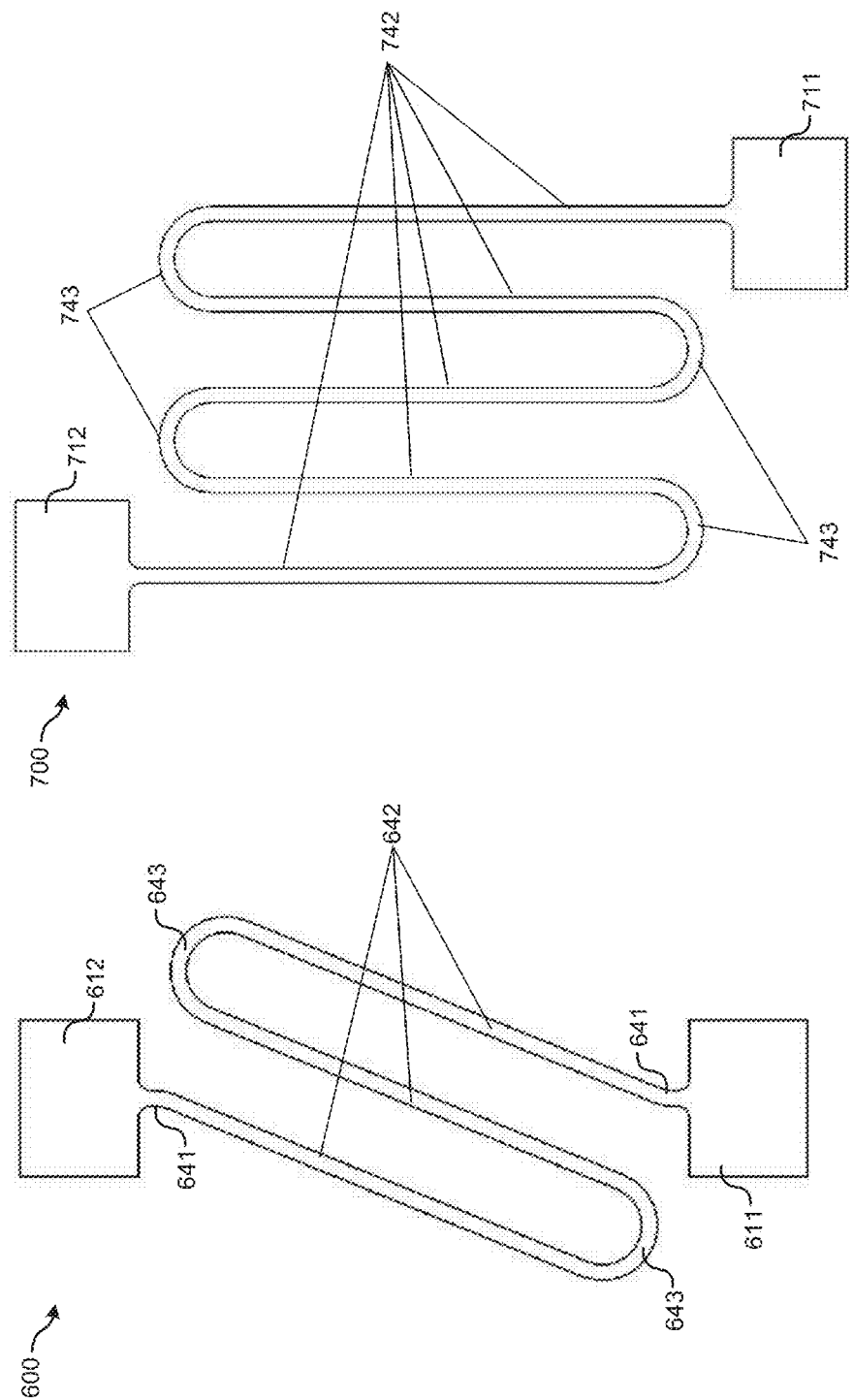

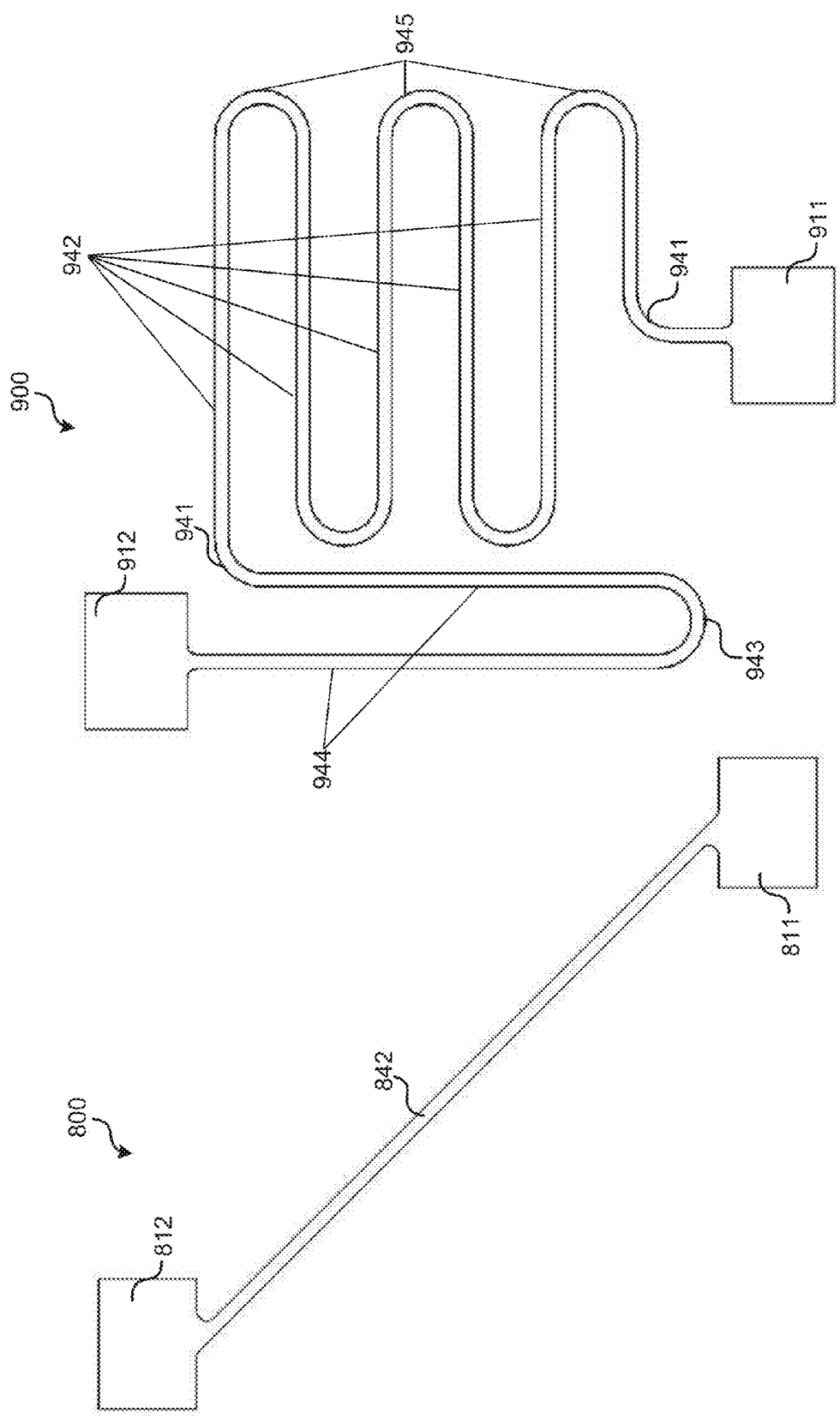

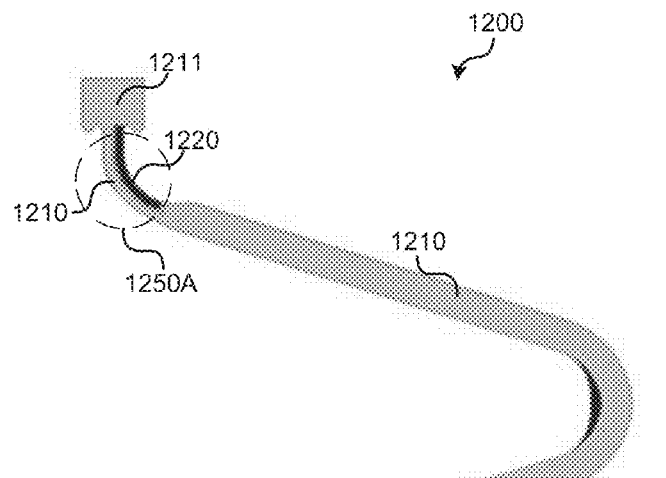
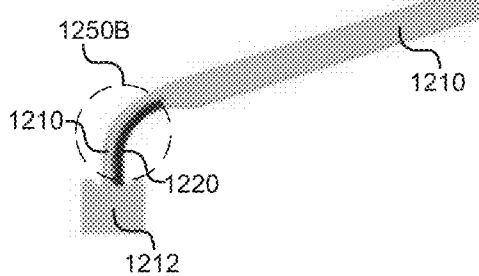
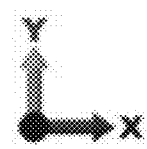
Fig. 18A
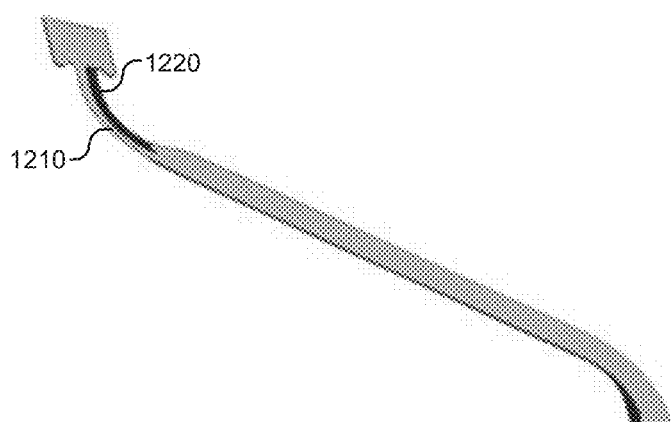
Fig. 18B

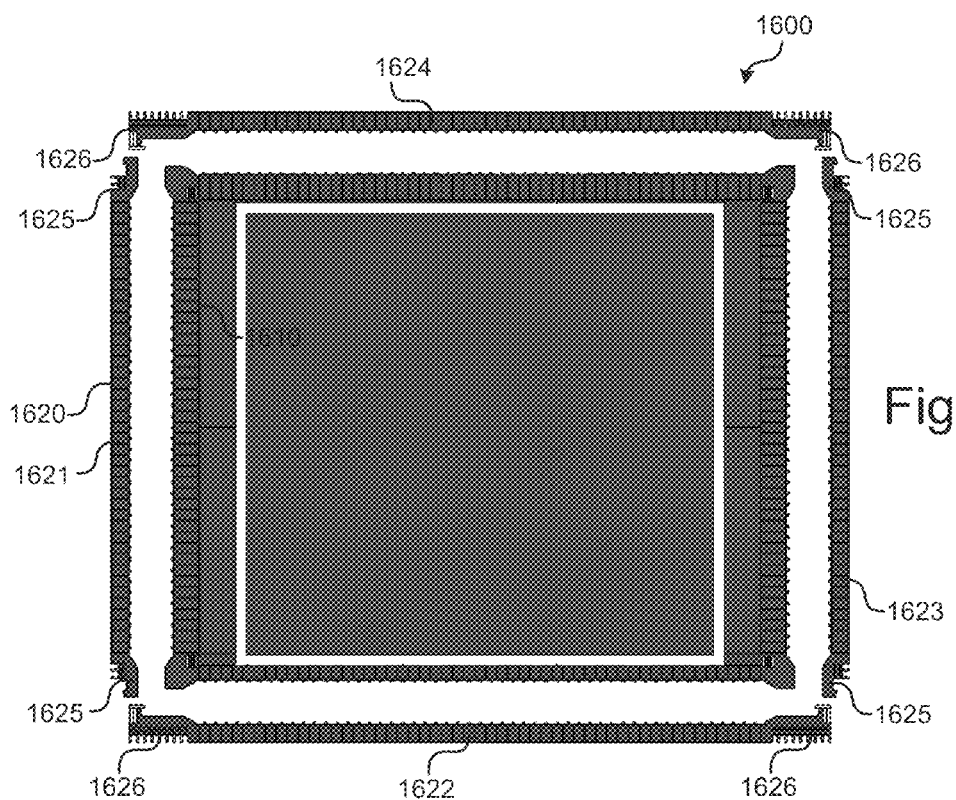
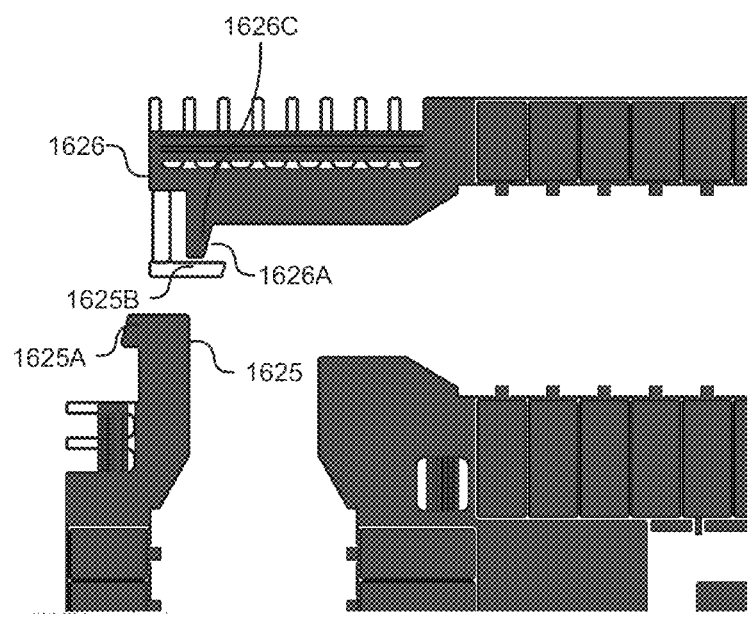
Fig. 23A
Fig. 23B

ELECTRICAL BAR LATCHING FOR LOW STIFFNESS FLEXURE MEMS ACTUATOR

CROSS-REFERENCE TO RELATED APPLICATIONS

This application is a continuation-in-part of and the claims the benefit of U.S. patent application Ser. No. 14/677,730 filed Apr. 2, 2015, which claims the benefit of U.S. Provisional Patent Application No. 61/989,457 filed May 6, 2014, each of which is incorporated herein by reference in its entirety.

TECHNICAL FIELD

The present disclosure relates generally to low stiffness flexures, and more particularly, to an electrical bar latching structure and method that may be used to buckle the flexures during assembly of actuators and motion stages such as, for example, motion stages for microelectromechanical systems (MEMS).

BACKGROUND

Flexures are used in systems where there is motion between one portion of the system and another. In order to create the motion, there must be a force. In some cases, this force comes from an actuator or motor that provides a controlled force that creates movement. In such systems, flexures are usually used to connect the moving portion of the system to the stationary portion of the system. The flexure must be designed so that its stiffness is low enough so as to not impede motion in the desired direction. In particular, to reduce the force requirements on the actuator or motor, the stiffness of the flexure must be as low as possible in the movement direction.

During design of a low stiffness flexure, the cross section of the flexure is usually designed to be as small as possible along the direction of bending, and the length is made as long as possible. However, there are limits on the design of the dimensions of conventional flexures. In some systems, these dimensions are limited by fabrication limits. For example, stamped metal flexures cannot be made too thin or too long without affecting handling and manufacturability. In other systems, the desire to make the cross section of the flexure as small as possible conflicts with other system requirements. For example, if the flexure is designed to carry electricity, making the flexure cross section very small increases the resistance, which wastes power and can lead to failure if enough current flows through the flexure.

BRIEF SUMMARY OF THE DISCLOSURE

In accordance with embodiments of the technology disclosed herein, A MEMS actuator including buckled flexures and a method of assembling the actuator are described. In one embodiment, the MEMS actuator includes an inner frame; an outer frame including a plurality of latched electrical bars, where a first of the plurality of latched bars includes a latch protrusion secured to a corresponding latch groove of a second of the plurality of latched bars; and a plurality of buckled flexures coupling the inner frame to the outer frame. In embodiments, the plurality of buckled flexures electrically and mechanically couple the inner frame to the outer frame.

In one embodiment, the plurality of latched electrical bars consists of the first and the second latched bars. In this embodiment, each of the first and second latched bars is coupled to the inner frame by a corresponding plurality of buckled flexures, and the first latched bar includes a plurality of latch protrusions secured to a corresponding plurality of latch grooves of the second latched bar. In an alternative embodiment, the plurality of latched electrical bars include four latched electrical bars, and each of the four electrical bars is coupled to the inner frame by a corresponding plurality of buckled flexures.

In one embodiment, a MEMS actuator may be assembled by providing a MEMS actuator with unbuckled flexures coupling an outer frame of the MEMS actuator to an inner frame of the MEMS actuator, where the outer frame includes a plurality of unlatched electrical bars; and latching the plurality of electrical bars by securing a latch protrusion of a first of the plurality of electrical bars to a corresponding latch groove of a second of the plurality of electrical bars, where the flexures are in a buckled state when the electrical bars are latched. In implementations of this embodiment, latching the plurality of electrical bars includes compressing the unbuckled flexures of the MEMS actuator along an axial direction from the outer frame to the inner frame.

As illustrated by these embodiments, the MEMS actuator flexures may be buckled during assembly of the MEMS actuator by incorporating an electrical bar latching mechanism into the design of an outer frame of the MEMS actuator. Accordingly, the process of buckling the flexures may be seamlessly integrated into a MEMS actuator assembly process.

Other features and aspects of the disclosure will become apparent from the following detailed description, taken in conjunction with the accompanying drawings, which illustrate, by way of example, the features in accordance with various embodiments. The summary is not intended to limit the scope of the invention, which is defined solely by the claims attached hereto.

BRIEF DESCRIPTION OF THE DRAWINGS

The disclosed technology, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 9 is a plan view of another example embodiment of a flexure in accordance with the disclosed technology.

FIG. 10 is a plan view of another example embodiment of a flexure in accordance with the disclosed technology.

FIG. 11 is a plan view of another example embodiment of a flexure in accordance with the disclosed technology.

FIG. 12 is a plan view of another example embodiment of a flexure in accordance with the disclosed technology.

FIG. 13 is a plan view of another example embodiment of a flexure in accordance with the disclosed technology.

FIG. 14 is a plan view of another example embodiment of a flexure in accordance with the disclosed technology.

FIG. 18A is a plan view of an example embodiment of a split root flexure as fabricated in accordance with the disclosed technology.

FIG. 18B is a plan view of the split root flexure of FIG. 18A as fabricated

FIG. 23A illustrates another example MEMS actuator with an outer frame including four electrical bars that have not been latched in accordance with the disclosed technology.

FIG. 23B is a magnified view of the latching mechanisms of the MEMS actuator of FIG. 23A.

Figure 1:
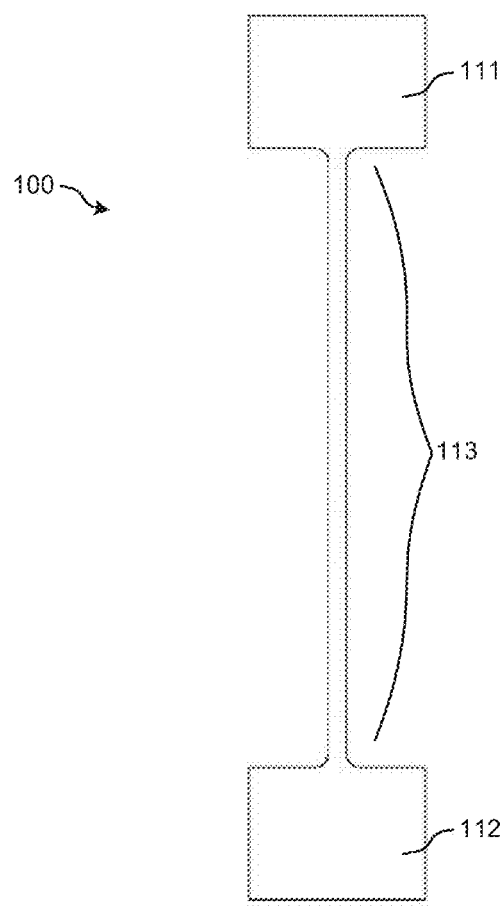
FIG. 1 is a plan view of an example embodiment of a flexure in accordance with the disclosed technology.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION

In accordance with various embodiments of the disclosed technology, new flexures are disclosed that include a first end connected to a first frame, a second end connected to a second frame, and a buckled section connecting the first end to the second end. The disclosed flexures operate in the buckling state without failure, thereby allowing the stiffness of the flexure to be several orders of magnitude softer than when operated in a normal state. The flexures may be used in actuators and motion stages such as, for example, motion stages for microelectromechanical systems (MEMS). In one particular embodiment, the flexures may be implemented in a MEMS actuator that moves an image sensor of a camera package.

In various embodiments, illustrated below, the buckled section (i.e., flexible portion) of the flexures is designed to be flexible such that a cross section of the flexible portion along its direction of bending (i.e., thickness and width) is small, while its length is relatively long. For example, in embodiments the flexible section may be 10 to 30 micrometers wide, 1 to 3 micrometers thick, and 500 to 800 micrometers long. In one particular embodiment, the flexible section is 25 micrometers wide, 1.5 micrometers thick, and 600 micrometers long. Additionally, the flexures may be designed to fit geometric constraints and minimize stiffness and stress of the deformed flexure.

In embodiments, the flexures may be manufactured using MEMS technology by patterning their design using photolithography and etching a polysilicon layer deposited on a silicon wafer coated with oxide. In additional embodiments, the flexures may be fabricated using a variety of processes such as, for example, stamping, etching, laser cutting, machining, three dimensional printing, water jet cutting, etc.

A variety of materials may be used to form the flexures, such as, for example, metal, plastic, and polysilicon. In implementations, the flexures may comprise one layer, two layers, or three layers of these materials. In one embodiment, a flexure is formed of layers of polysilicon and metal, whereby the polysilicon layer provides improved flexibility and reliability and the metal layer provides improved electrical conductivity. In further embodiments, further described below, the flexure may have a variable width, split layers, offset layers, or some combination thereof to achieve desired properties such as electrical conductivity and flexibility. As would be appreciated by one having skill in the art, other combinations of materials may be used to achieve the desired properties of the flexures.

In additional embodiments, described below, the flexures may be buckled during assembly of a MEMS actuator by incorporating an electrical bar latching mechanism into the design of an outer frame of the MEMS actuator. Accordingly, the process of buckling the flexures may be seamlessly integrated into a MEMS actuator assembly process.

Figure 2A:
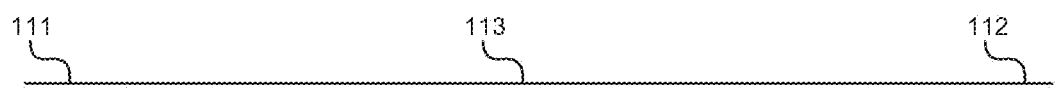
FIG. 2A is an edge view of the flexure of FIG. 1 as fabricated.
Figure 2B:
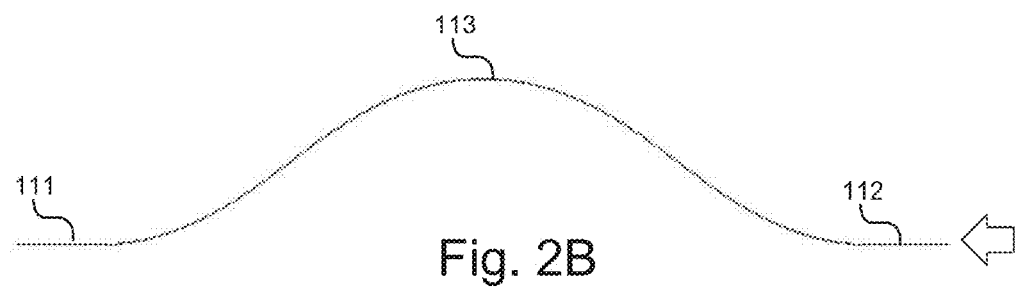
FIG. 2B is an edge view of the flexure of FIG. 1 in a buckled state.

FIG. 1 is a plan view of an exemplary flexure 100 in accordance with one embodiment. As illustrated, flexure 100 comprises a first support end 111, a second support end 112, and a flexible portion 113 connecting support end 111 to support end 112. As described above, in various embodiments flexible portion 113 is designed to be flexible such that a cross section of portion 113 along its direction of bending (i.e., thickness and width) is small, while its length is relatively long. FIGS. 2A-2B illustrate edge views of flexure 100. FIG. 2A illustrates flexure 100 in a pre-buckled state after fabrication. FIG. 2B illustrates flexure 100 in a buckled state. In one embodiment, illustrated by FIG. 2B, flexure 100 transitions to the buckled state after support end 112 is displaced toward support end 111, thereby causing flexible portion 113 to buckle up or down. Because the thickness of example flexure 100 is smaller than its width, flexure 100 buckles up or down as shown in FIG. 2B. In other embodiments where the thickness of the flexure is greater than its width, the flexible portion may buckle sideways.

Figure 3:
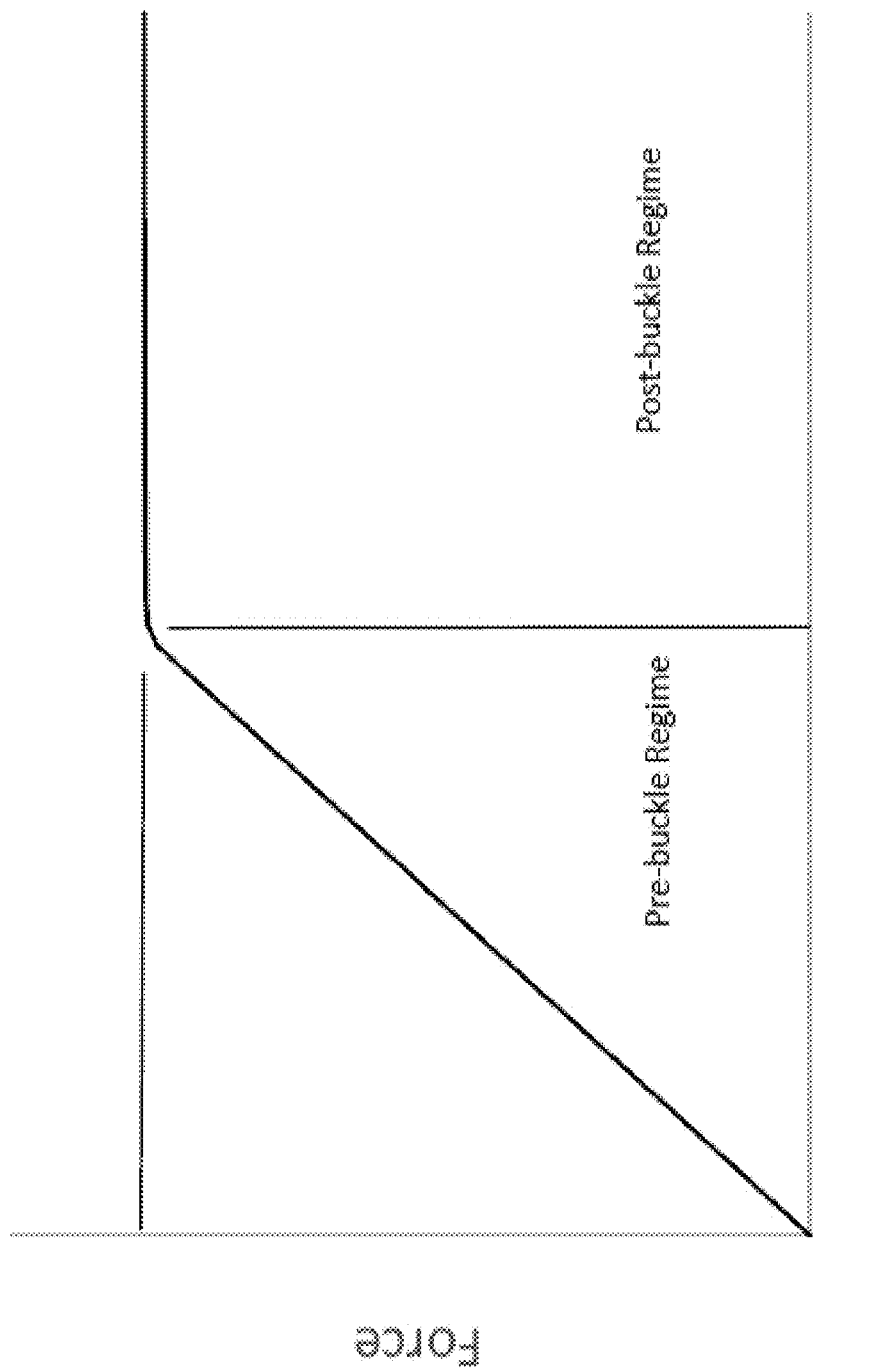
FIG. 3 is a Force versus Displacement plot of an example embodiment of a flexure in accordance with the disclosed technology.

FIG. 3 is a Force versus Displacement plot of an example embodiment of a flexure in accordance with the disclosed technology. As illustrated, there is a pre-buckle regime or state in which the stiffness of the flexure, calculated as the change in displacement divided by the change in force, is relatively high. Once the flexure buckles, the flexure enters a post-buckle regime in which the stiffness of the flexure is dramatically reduced. By operating in the post-buckle regime, the stiffness of the flexure is dramatically lowered. Accordingly, in various embodiments of the disclosed technology, the flexure operates in the post-buckle regime (e.g., as illustrated by FIG. 2B) as opposed to the pre-buckle or fabricated regime (e.g., as illustrated by FIG. 2A). To prevent failure of the flexure, in various embodiments a motion limiter that limits motion of the flexure may be included in a system (e.g., actuator) that includes the flexure.

Figure 4A:
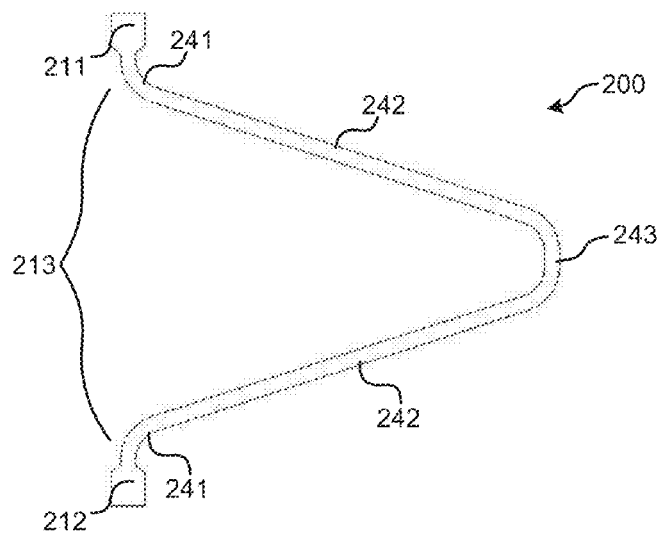
FIG. 4A is a plan view of another example embodiment of a flexure in accordance with the disclosed technology.

FIG. 4A is a plan view of another example flexure 200 in accordance with the disclosed technology. As illustrated, flexure 200 comprises a first support end 211, a second support end 212, and a flexible portion 213 connecting first support end 211 and second support end 212. Like flexure 100, flexure 200 buckles in radial directions between support ends 211 and 212 and has low stiffness in the post-buckle regime. Additionally, the design of flexure 200 provides low stiffness in a tangential direction to support ends 211 and 212. In particular, flexure 200 has a "V"-shaped design comprising two long and straight portions 242, curved portions 241 connecting straight portions 242 to support ends 211-212, and a curved portion 243 connecting straight portions 242 together.

In various embodiments, the curvatures of curved portions 241-242, the angle of the "V" and the length of straight portions 242 are designed to fit geometric constraints and minimize stiffness and stress of the deformed flexure. For example, in one particular embodiment the angle of the "V" shape can be 35 degrees, the radii of curvatures 241 and 243 can be 50 micrometers, the length of the straight portions 242 can be 650 micrometers, and the separation between the support ends 211 and 212 can be 700 micrometers.

Figure 4B:
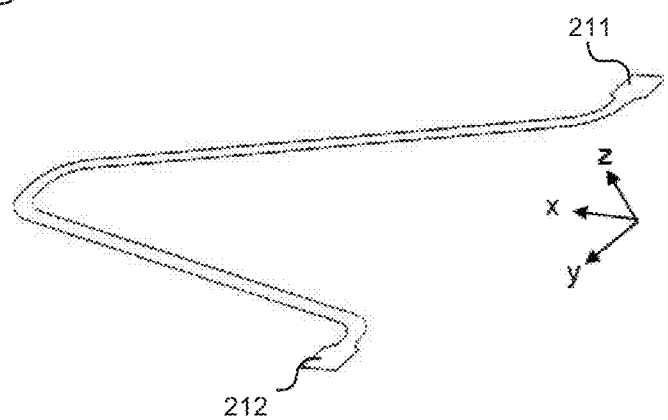
FIG. 4B is a three-dimensional perspective view of the flexure of FIG. 4A as fabricated.
Figure 4C:
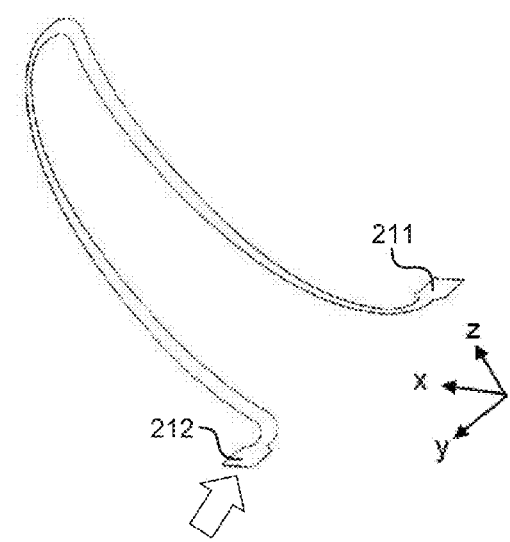
FIG. 4C is a three-dimensional perspective view of the flexure of FIG. 4A in a buckled state.

FIGS. 4B-4C illustrate three-dimensional perspective views of flexure 200. FIG. 4B illustrates flexure 200 as fabricated. FIG. 4C illustrates flexure 200 in a buckled state. In one embodiment, illustrated by FIG. 4C, flexure 200 transitions to the buckled state after support end 212 is deflected toward support end 211, thereby causing flexible portion 213 to buckle in three dimensions. Because the thickness of example flexure 200 is smaller than its width, and because of the "V"-shaped geometric design, flexure 200 buckles in three dimensions. This ensures that the buckled flexure has very low stiffness between support ends 211 and 212 in both radial and tangential directions (i.e., x and y directions shown in FIGS. 4B-4C).

Figure 5:
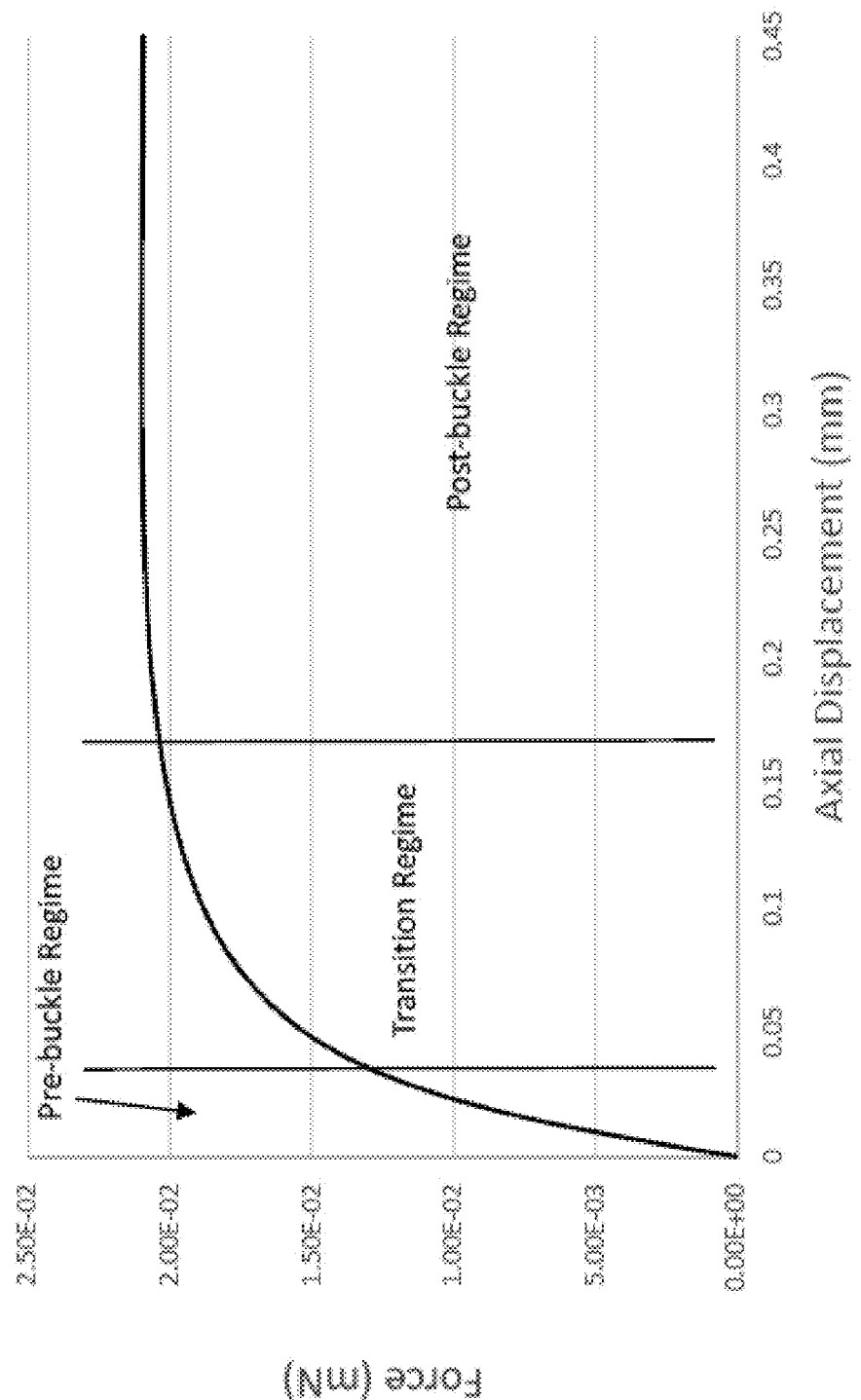
FIG. 5 is a Force versus Displacement plot of the flexure of FIG. 4A.

FIG. 5 is a biased Force versus biased Displacement plot of flexure 200 that was calculated using finite element analysis. As illustrated, there is a pre-buckle regime with low axial displacement of moving support end 212, in which the stiffness of flexure 200, calculated as the change in displacement divided by the change in force, is relatively high. This pre-buckle regime between zero axial displacement and approximately 0.05 mm axial displacement corresponds to the shape shown in FIG. 4B. After flexure 200 buckles, the stiffness of the flexure is dramatically reduced. This post-buckle regime beyond approximately 0.15 mm axial displacement corresponds to the shape shown in FIG. 4C. In this embodiment, there is a gradual transition regime between the pre-buckle and post-buckle regimes between approximately 0.05 mm and 0.15 mm axial displacement. By operating in the post-buckle regime, the stiffness of the flexure is dramatically lowered. As illustrated by FIG. 5, in the post-buckle regime the stiffness of the flexure may be several orders of magnitude less than in the pre-buckle regime. Accordingly, in various embodiments of the disclosed technology, the flexure operates in the post-buckle regime (e.g., as illustrated by FIG. 3C) as opposed to the pre-buckle or fabricated regime (e.g., as illustrated by FIG. 3B).

Figure 6:
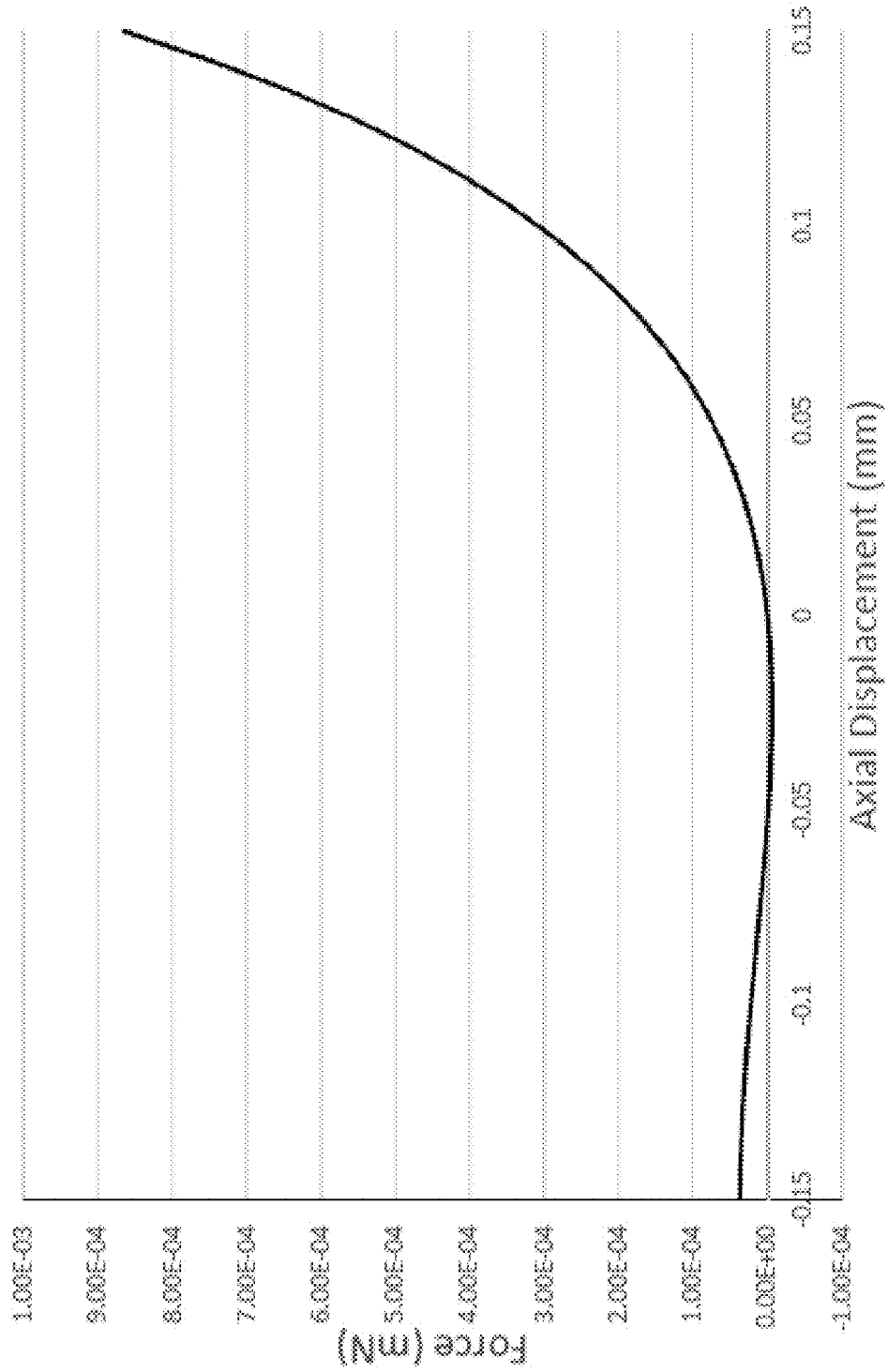
FIG. 6 is a Biased Force versus Biased Axial Displacement plot of the flexure of FIG. 4A in a buckled state.

FIG. 6 is a Biased Force versus Biased Displacement plot of flexure 200 in a buckled state. As illustrated, flexure 200 is pre-deformed axially by displacing the moving support end 212 toward the stationary support end 211 by 300 micrometers. The change in force corresponding to axial displacement toward the biased position is shown. The force required to generate a displacement of 150 micrometers to the biased position is less than 0.9 micro-Newtons. In embodiments, the biased force versus biased displacement may be nonlinear and asymmetric. However, since the flexure is softer than the system's stiffness in various embodiments, the nonlinearity that flexure 200 may introduce to the system is negligible.

Figure 7:
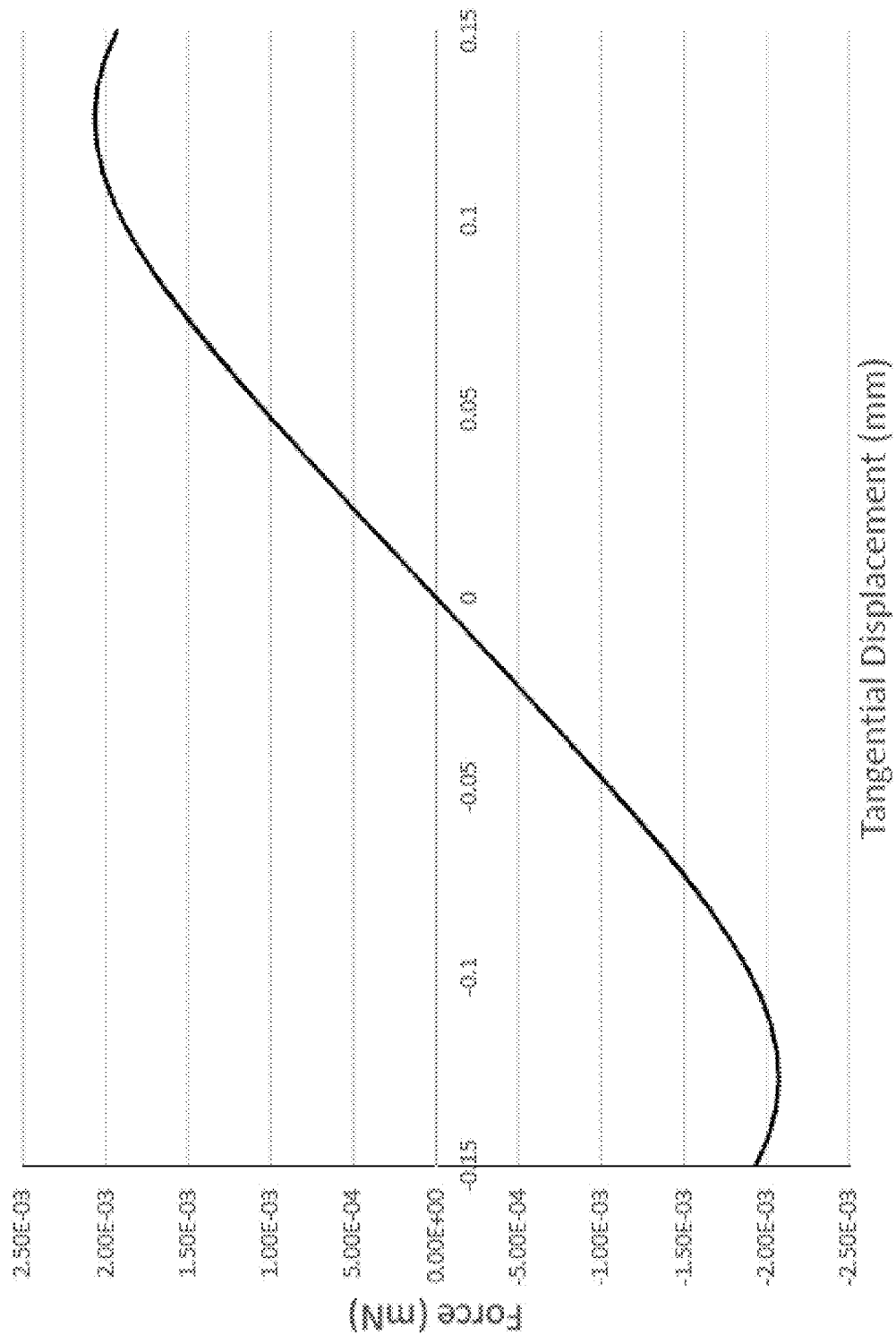
FIG. 7 is a Tangential Force versus Tangential Displacement plot of the flexure of FIG. 4A in a buckled state.

As described above, flexure 200 is pre-deformed axially to the biased position by displacing moving support end 213 toward stationary support end 212 (e.g., by 300 micrometers). Afterward, the tangential force corresponding to tangential displacement may be measured and plotted as shown in FIG. 7. As illustrated, the force required to generate a tangential displacement of 150 micrometers is less than 2.5 micro-Newtons. The force is linear within the range of ±0.12 micrometers, and starts to curve outside of this range. However, since the flexure is very soft in various embodiments, the nonlinearity that flexure 200 may introduce to the system is negligible. In various embodiments, the plots of FIGS. 6 and 7 may be used to design a full flexure system.

Figure 8:
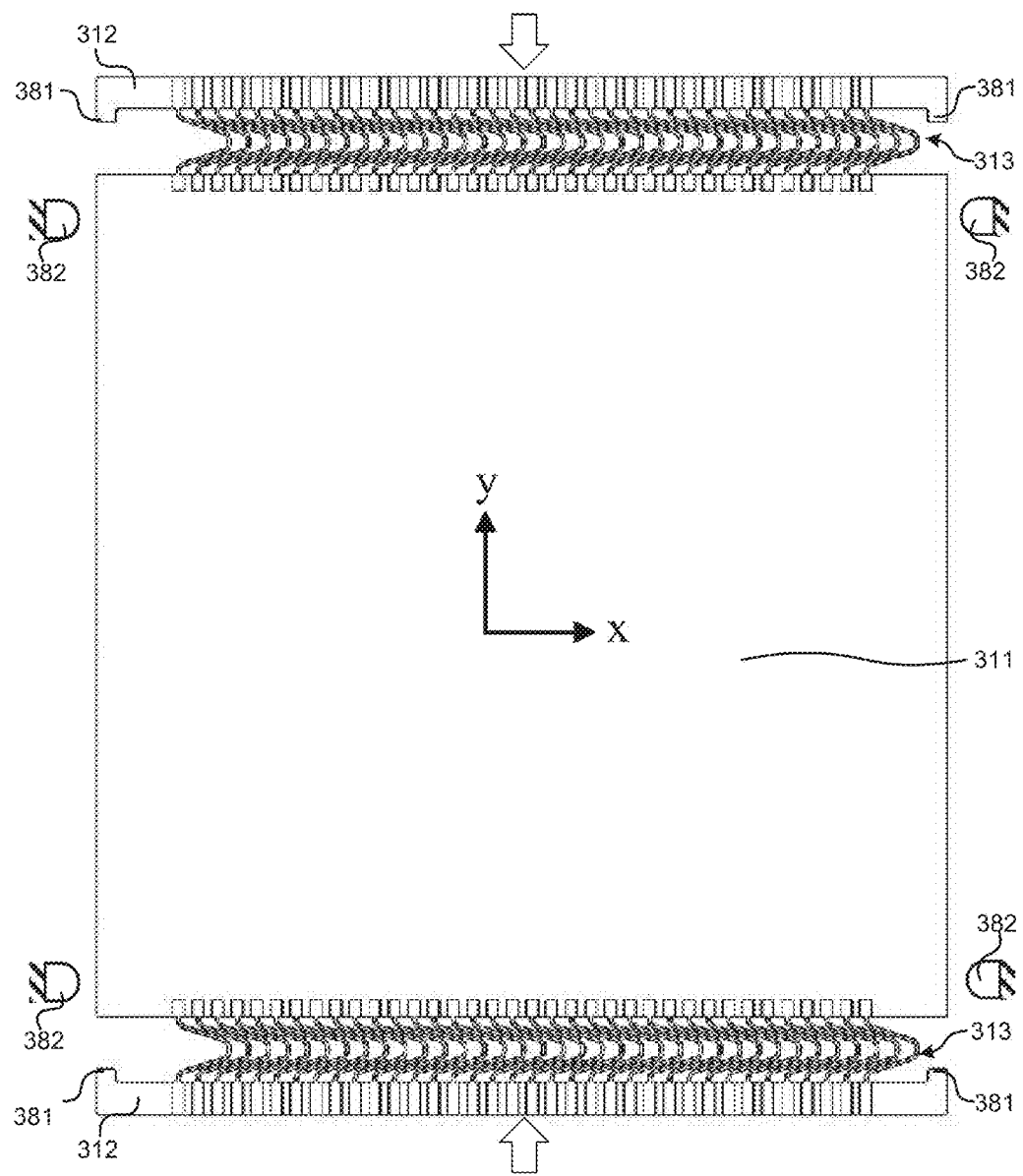
FIG. 8 is a plan view of an example embodiment of a stage using an array of flexures in accordance with the disclosed technology.

FIG. 8 is a plan view of an example embodiment of a stage using an array of flexures in accordance with the disclosed technology. As illustrated, the stage includes a movable platform 311 connected to rigid bars or support ends 312 by flexure arrays 313. In this embodiment, for each of the flexures of flexure arrays 313 the first support end is part of movable platform 311 of the stage, the second support end is directly connected to one of rigid bars 312, and a flexible portion connects the first support end (movable platform 311) to the second support end (rigid bars 312). In various embodiments, Illustrated by FIG. 8, low stiffness in two-dimensional motion may be achieved by pushing the rigid bars 312 toward each other (e.g., in the illustrated y direction) such that the flexures of flexure arrays 313 enter the post-buckle regime in their full motion range. In these embodiments, the forces exerted by the flexure arrays 313 may balance out on both sides such that there is no net force on platform 311.

In various embodiments, the stage and/or a system including the stage may include motion limiters that limit horizontal and vertical motion of movable platform 311, and correspondingly, the flexures. For example, in FIG. 8 the system includes motion limiters 381 that limit motion in the vertical y direction, as well as motion limiters 382, that limit motion in the horizontal x direction. As illustrated, motion limiters 381 are incorporated into rigid bars 312, thereby preventing excessive movement of the first support ends of flexures 313 with respect to the second support ends. Motion limiters 382 prevent horizontal over displacement of the movable platform 311 relative to rigid bars or support ends 312. Accordingly, motion limiters 381-382 may prevent failure of the buckled portion of flexures 313 due to excessive displacement in the x-y plane.

In additional embodiments, the flexures 313 may carry electrical current from the movable platform 311 to the rigid ends 312. In these embodiments, the flexures 313 may carry electrical current to an electrical component of the stage (e.g., an image sensor). For example, electrical pads may contact an electrical component of movable platform 311 and a circuit board of rigid ends 312. In this example, each of the flexure support ends may contact a respective electrical pad. In implementations of these embodiments, flexures 313 carry electrical current with low resistance and are designed to be as soft as possible to avoid additional force requirements on the motors (not shown) that move the stage.

FIG. 9 is a plan view of another example embodiment of a flexure 400 in accordance with the disclosed technology. As illustrated, flexure 400 comprises first support end 411, second support end 412, and a flexible portion connecting support end 411 and support end 412. Flexure 400 has an "S"-shaped design with the flexible portion comprising long and straight portions 442, curved portions 441 connecting straight portions 442 to support ends 411-412, and curved portions 443 connecting straight portions 442 with each other. In various embodiments, the curvatures of curved portions 441 and 443, the angles between straight portions 442 and 443, and the length of straight portions 442 are designed to fit geometric constraints and minimize stiffness and stress of the deformed flexure.

FIG. 10 is a plan view of another example embodiment of a flexure 500 in accordance with the disclosed technology. As illustrated, flexure 500 comprises first support end 511, second support end 512, and a flexible portion connecting support end 511 and support end 512. Flexure 500 has a serpentine-shaped design with the flexible portion comprising long and straight portions 542, curved portions 541 connecting straight portions 542 with support ends 511-512, and curved portion 543 connecting straight portions 542 with each other. In various embodiments, the curvatures of curved portions 541 and 543, the number of turns in the serpentine design, and the length of straight portions 542 are designed to fit geometric constraints and minimize stiffness and stress of the deformed flexure.

FIG. 11 is a plan view of another example embodiment of a flexure 600 in accordance with the disclosed technology. As illustrated, flexure 600 comprises first support end 611, second support end 612, and a flexible portion connecting support end 611 and support end 612. Flexure 600 has an "S"-shaped design with the flexible portion comprising long and straight portions 642 aligned in a radial direction, curved portions 641 connecting straight portion 642 and support ends 611-612, and curved portions 643 connecting the straight portions with each other.

FIG. 12 is a plan view of another example embodiment of a flexure 700 in accordance with the disclosed technology. As illustrated, flexure 700 comprises first support end 711, second support end 712, and a flexible portion connecting support end 711 and support end 712. In flexure 700, support ends 711 and 712 are not tangentially aligned. Flexure 700 has an serpentine-shaped design with the flexible portion comprising long and straight vertical portions 742, and curved portions 743 connecting portions 742 with each other and with support ends 711-712.

FIG. 13 is a plan view of another example embodiment of a flexure 800 in accordance with the disclosed technology. As illustrated, flexure 800 comprises first support end 811, second support end 812, and a long and straight flexible portion 842 connecting support end 811 and support end 812. In flexure 800, support ends 811 and 812 are not tangentially aligned.

FIG. 14 is a plan view of another example embodiment of a flexure 900 in accordance with the disclosed technology. As illustrated, flexure 900 comprises first support end 911, second support end 912, and a flexible portion connecting support end 911 and support end 912. In flexure 900, support ends 911 and 912 are not tangentially aligned. Flexure 900 has a serpentine-shaped design with the flexible portion comprising horizontal, long and straight portions 942, vertical, long and straight portions 944, curved portions 941 connecting vertical portions 944 with horizontal portions 942, curved portion 943 connecting the vertical portions 944 with each other, and curved portions 945 connecting the horizontal portions 942 with each other.

In various embodiments, the shape of the flexures may be generalized by counting the numbers of horizontal and vertical straight portions of the flexure. For example, assume (n, m) represents a design with n vertical or close to vertical straight stripes, and m horizontal or close to horizontal straight stripes. In such an implementation, flexure 400 may be named as (0, 3), flexure 500 as (0, 5), flexure 600 as (3, 0), flexure 700 as (5, 0), flexure 800 as (1, 1), and flexure 900 as (2, 6).

Figure 15:
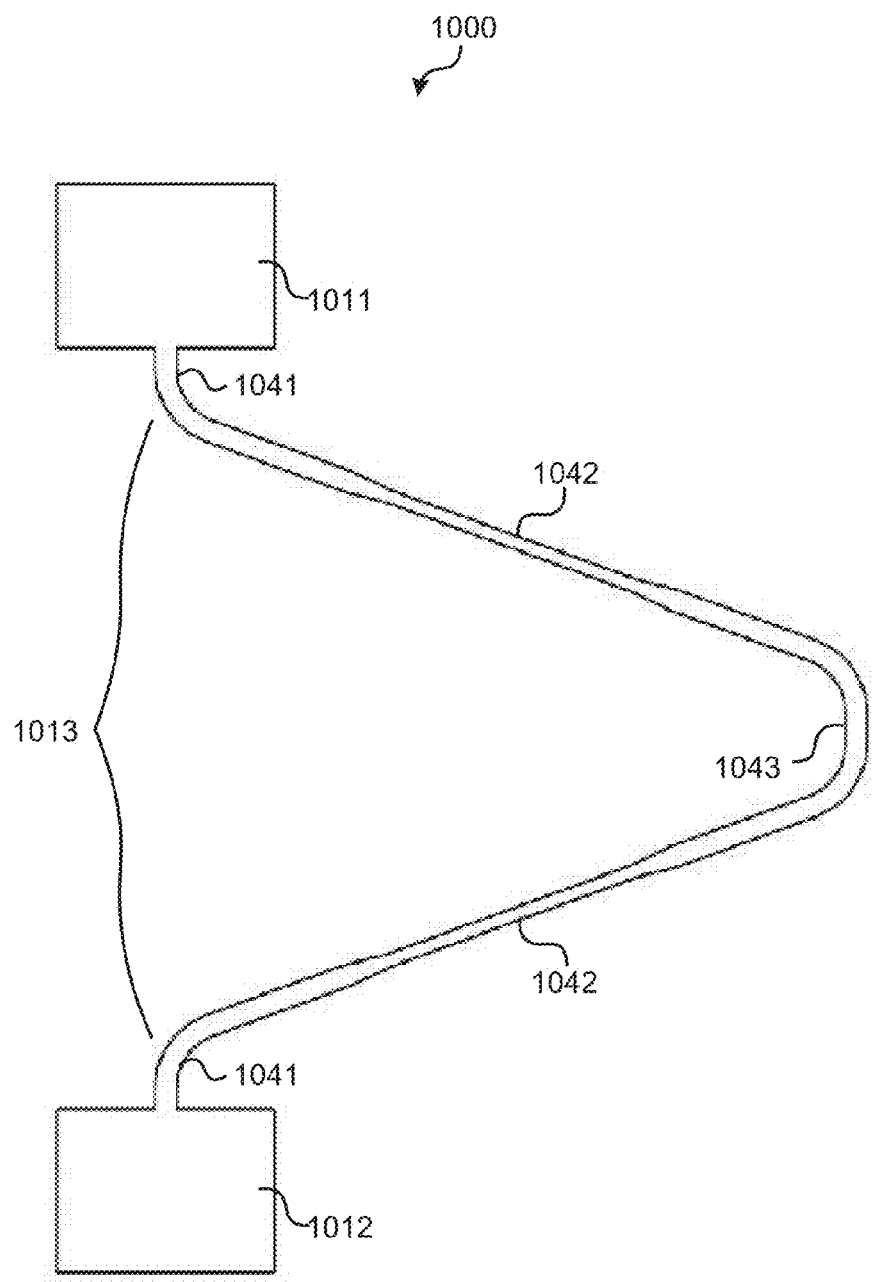
FIG. 15 is a plan view of an example embodiment of a variable width flexure in accordance with the disclosed technology.

FIG. 15 is a plan view of an example embodiment of a variable width flexure 1000 in accordance with the disclosed technology. As illustrated, flexure 1000 comprises first support end 1011, second support end 1012, and a flexible portion 1013 connecting support end 1011 and support end 1012. Flexure 1000 has a "V"-shaped design with the flexible portion 1013 comprising long and straight portions 1042 of variable width, curved portions 1041 connecting straight portions 1042 and support ends 1011-1012, and curved portion 1043 connecting straight portions 1042 with each other. In flexure 1000, the straight portions 1042 have a variable width, which in various embodiments may be adjusted to provide flexibility in the design of the flexure to tune the flexure's stiffness and other physical properties, such as, for example, the electrical resistance of the flexure. It should be noted that one having skill in the art would appreciate that a variable width could be implemented in the design of other flexures (e.g., those illustrated in FIGS. 5-14) to tune the aforementioned physical properties (e.g., electrical resistance and stiffness).

Figure 16:
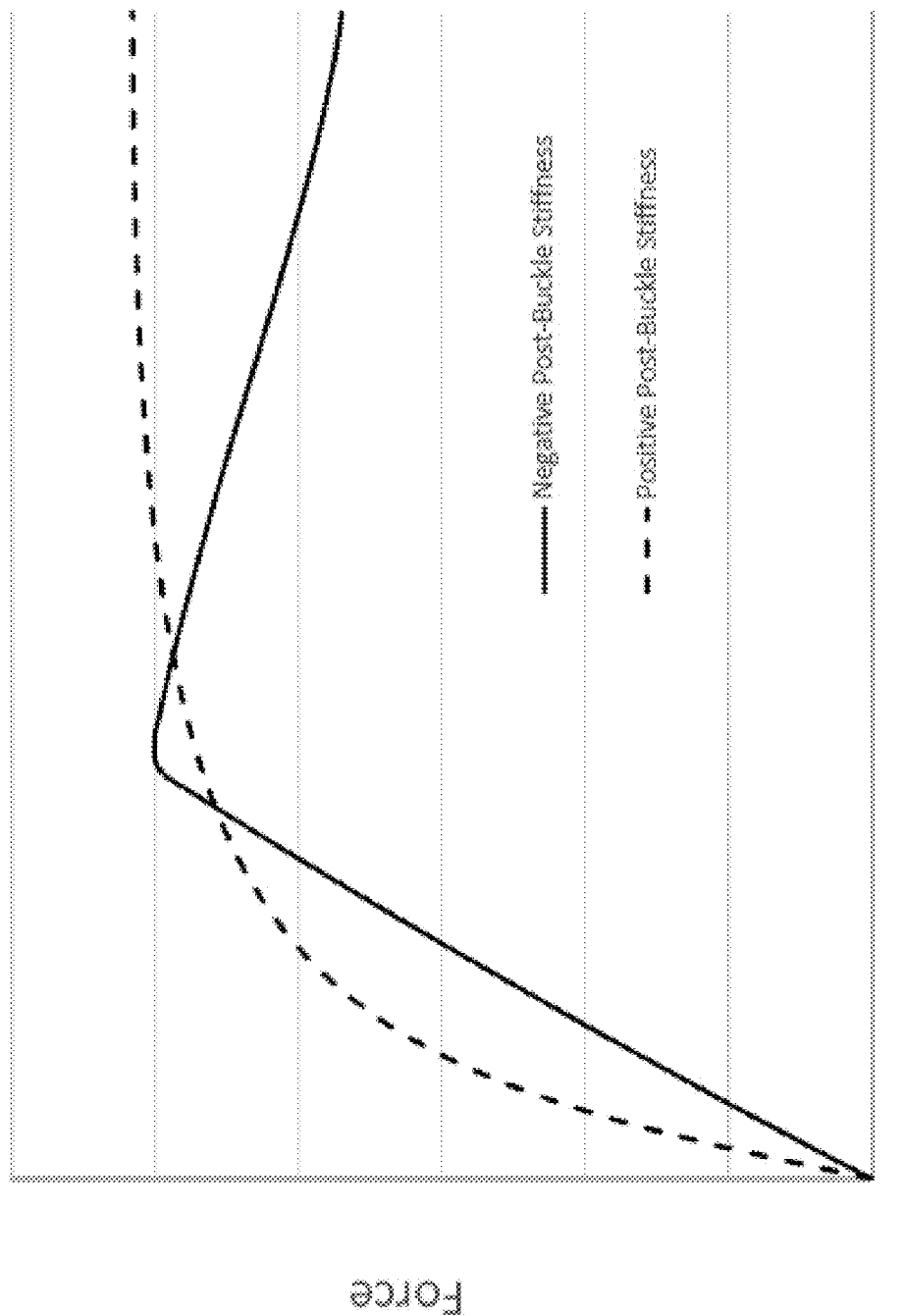
FIG. 16 is a Normalized Force versus Normalized Displacement plot showing the performance of different flexure designs in accordance with various embodiments of the disclosed technology.

FIG. 16 is a Normalized Force versus Normalized Displacement plot showing the performance of different flexure designs in accordance with various embodiments of the disclosed technology. As illustrated, the flexure may have a positive stiffness or negative stiffness in different post-buckle operation regimes.

Figure 17A:
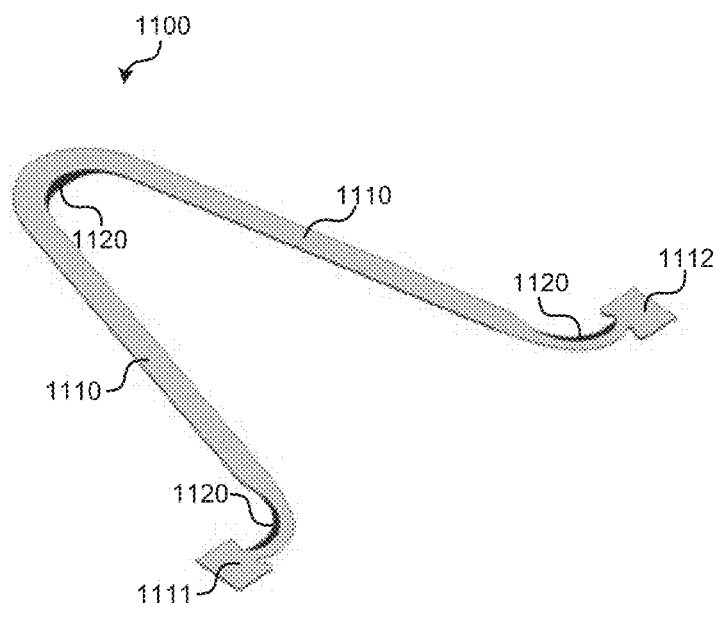
FIG. 17A is a top plan view of an example embodiment of an offset layer flexure as fabricated in accordance with the disclosed technology.
Figure 17B:
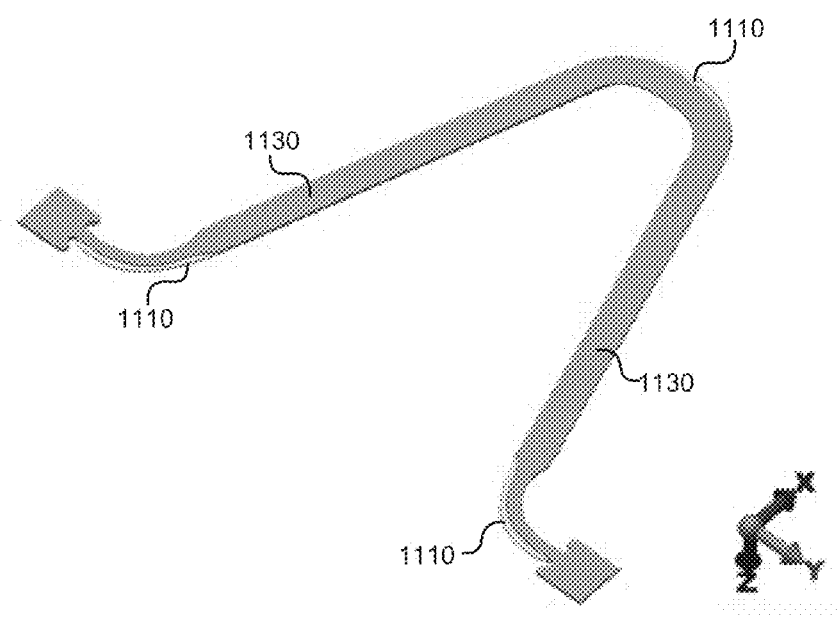
FIG. 17B is a bottom plan view of the offset layer flexure of FIG. 17A as fabricated.
Figure 17C:
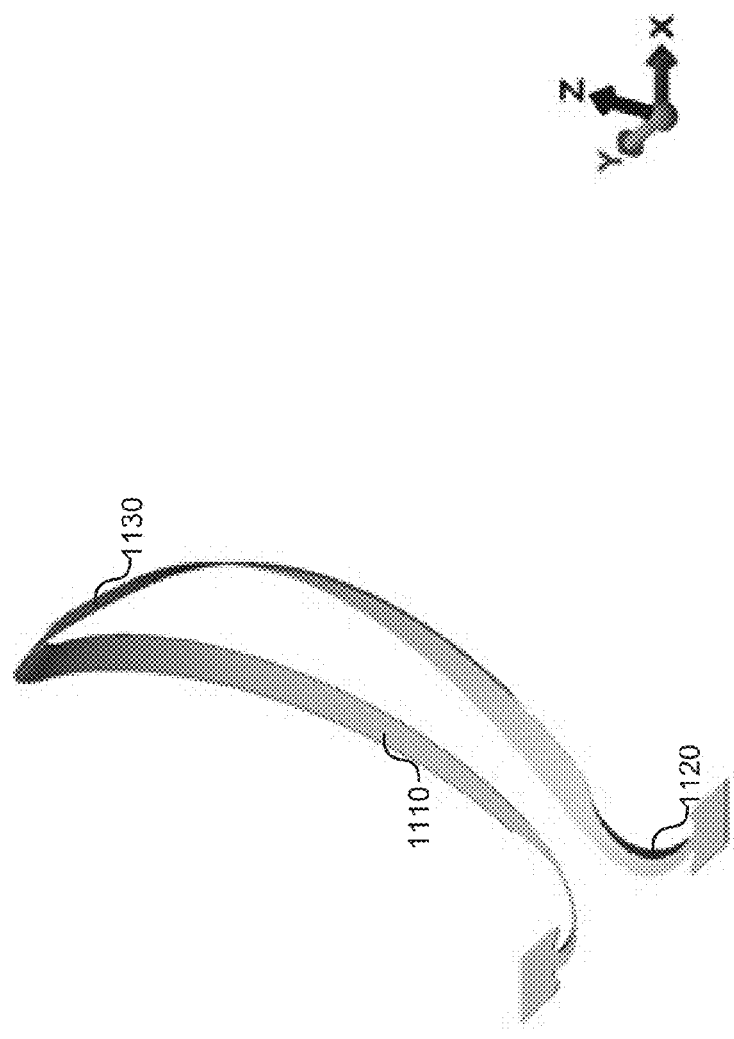
FIG. 17C is a three-dimensional perspective of the offset layer flexure of FIG. 17A in a buckled state.

FIGS. 17A-17C illustrate an example embodiment of a flexure 1100 comprising offset layers in accordance with the disclosed technology. FIGS. 17A and 17B are top and bottom plan views of flexure 1100 after fabrication. FIG. 17C is a three-dimensional perspective view of flexure 1100 in a buckled state. As illustrated, flexure 1100 includes a metal layer 1110, a third layer 1130, and a polysilicon layer 1120 between metal layer 1110 and third layer 1130. In embodiments, the third layer may comprise silicon oxide or a similar material. In flexure 1100, metal layer 1110 is offset from polysilicon layer 1120 and third layer 1130, thereby providing the benefit of reducing stress on flexure 1100 when it enters a buckled state shown in FIG. 17C.

Additionally, flexure 1100 comprises a variable width flexible portion that is narrower near the root ends of the flexure (i.e., the curved portions directly connected to support ends 1111 and 1112), and wider at the center of the flexible portion. In this embodiment, the narrower width near support ends 1111 and 1112 reduces the stiffness of flexure 1100 in a buckled state. The greater width at the center of the flexible portion improves the electrical resistance of flexure 1100.

Figure 18C:
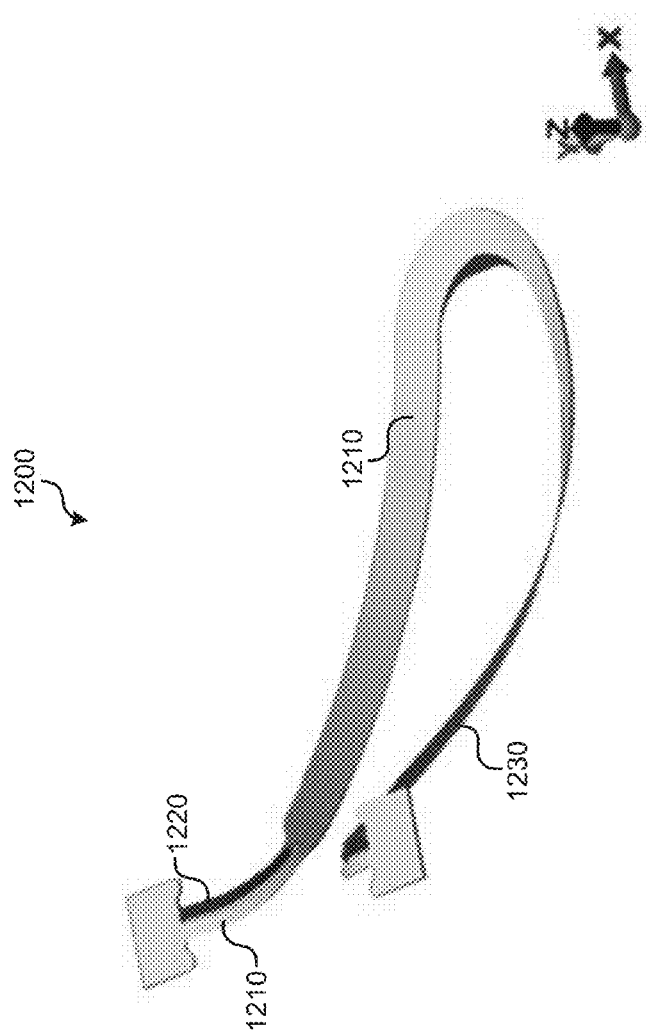
FIG. 18C is a three-dimensional perspective of the split root flexure of FIG. 18A in a buckled state.

FIGS. 18A-18C illustrate an example embodiment of a flexure 1200 comprising split roots in accordance with the disclosed technology. FIGS. 18A and 18B are top and bottom plan views of flexure 1200. FIG. 18C is a three-dimensional perspective view of flexure 1200 in a buckled state. As illustrated, flexure 1200 comprises split roots of metal 1210 and polysilicon 1220 at the curved portions 1250A-B directly connected to support ends 1211 and 1212 (i.e., near root ends of flexure). In embodiments, third layer 1230 and metal layer 1220 may also be split.

Figure 19A:
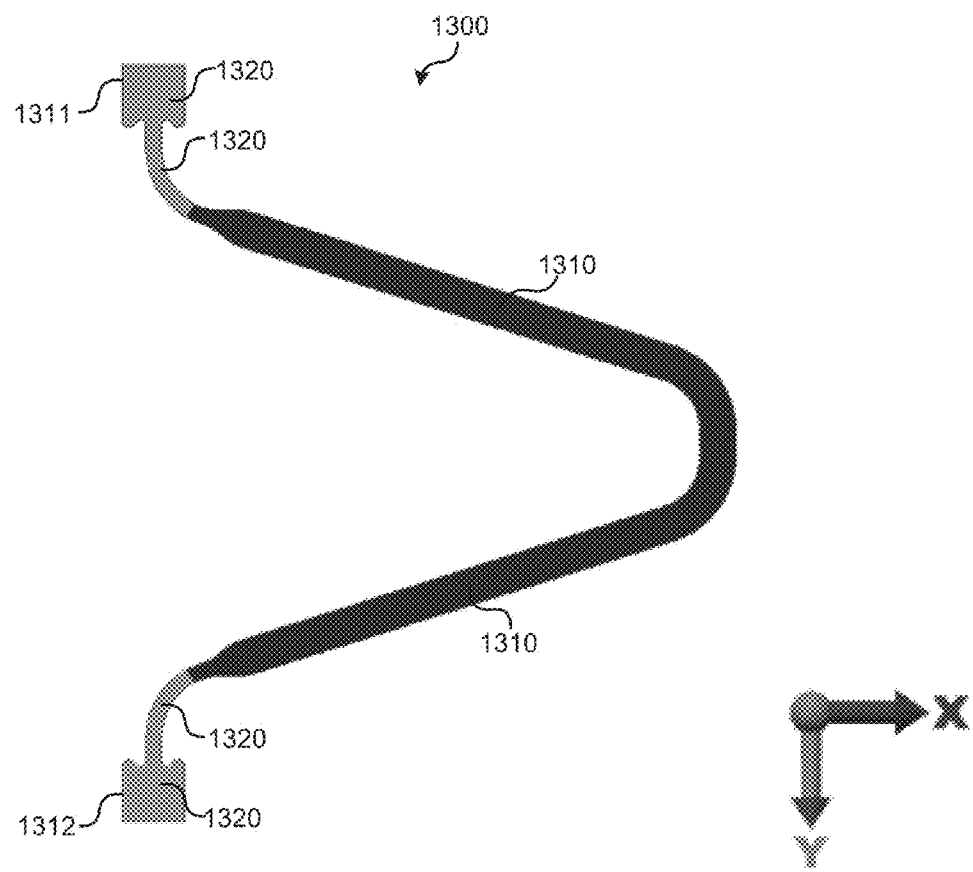
FIG. 19A is a plan view of an example embodiment of a flexure comprising different length layers in accordance with the disclosed technology.
Figure 19B:
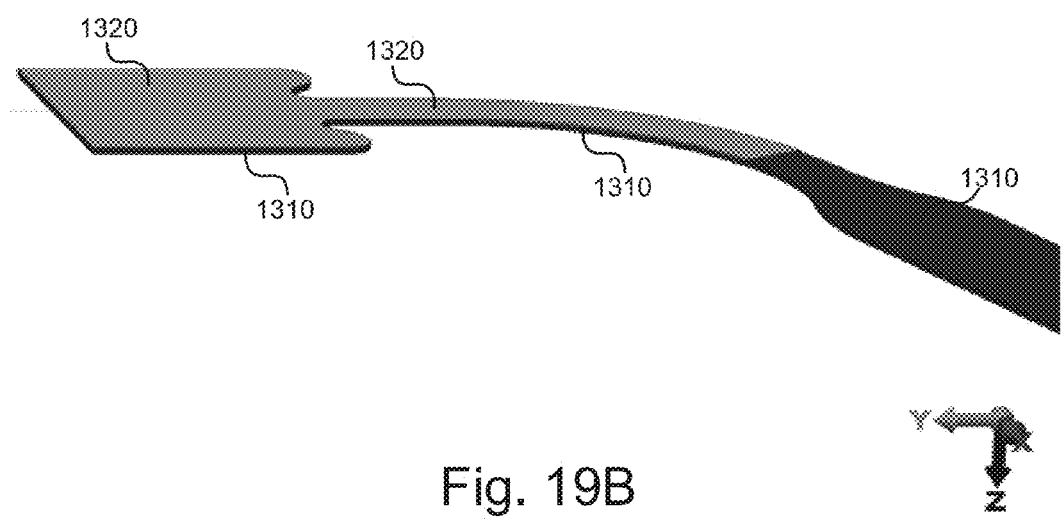
FIG. 19B is a three-dimensional perspective view of the flexure of FIG. 19A.

FIGS. 19A-19B illustrate an example embodiment of a flexure 1300 comprising different length layers in accordance with the disclosed technology. FIG. 19A is a plan view and FIG. 19B is a three-dimensional perspective view of flexure 1300. As illustrated, flexure 1300 includes a metal layer 1310 and a partial silicon oxide layer 1320 over metal layer 1310. In flexure 1300, only metal layer 1310 covers the entire length of the flexure, thereby ensuring lower stress and lower stiffness of flexure 1300. By contrast, silicon oxide layer 1320 only covers the ends of the flexure (support sections 1311-1312 and end of flexible section), thereby ensuring that the flexure buckles in the correct direction. In embodiments, layer 1320 can be silicon oxide or any other material that can provide a residual stress to curve the metal flexure 1300 up to the wanted direction. As would be appreciated by one having skill in the art, the lengths of the layers of the flexure may be varied to tune the physical properties of the flexure such as, for example, its stiffness and electrical resistance.

Figure 20A:
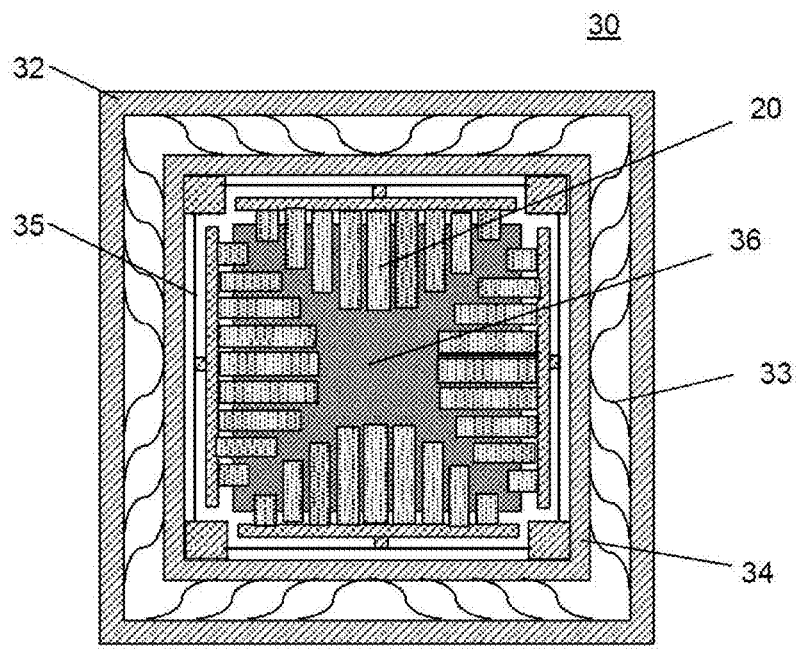
FIG. 20A illustrates a plan view of an actuator that may use the disclosed flexures in accordance with embodiments of the disclosed technology.
Figure 20B:
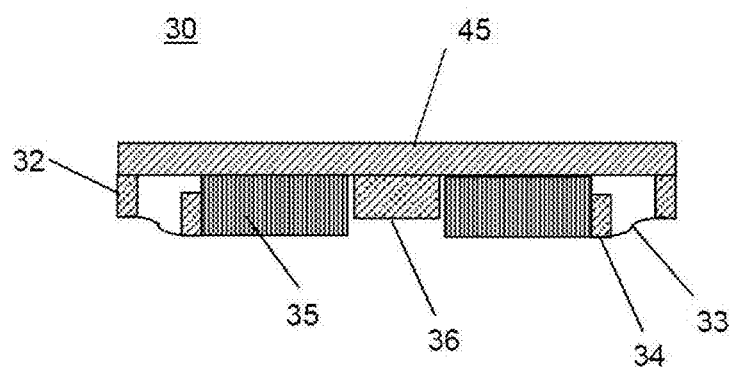
FIG. 20B illustrates a cross-sectional view of an actuator that may use the disclosed flexures in accordance with embodiments of the disclosed technology.
Figure 20C:
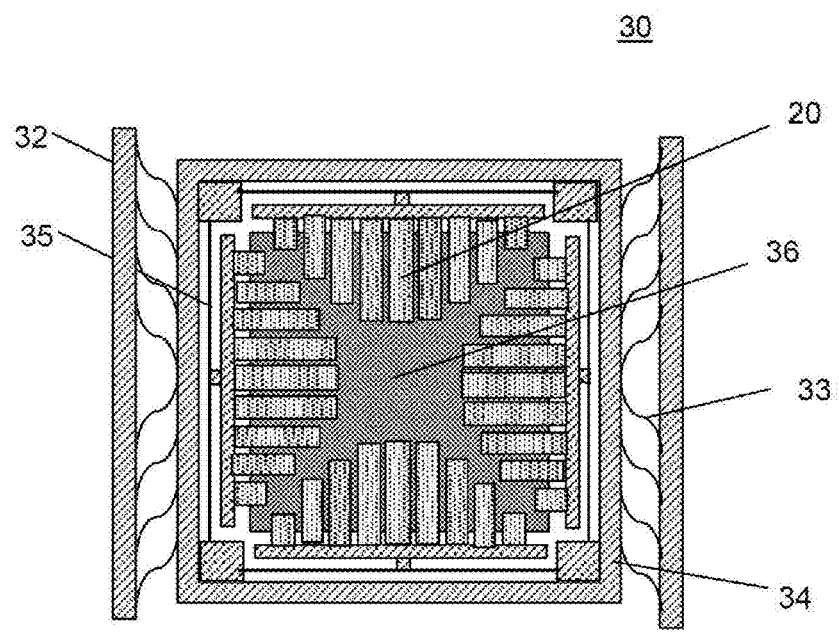
FIG. 20C illustrates a plan view of an actuator that may use the disclosed flexures in accordance with embodiments of the disclosed technology.

FIGS. 20A-20D illustrate actuators for moving an optoelectronic device that may use the flexures described herein in accordance with particular embodiments. FIG. 20A illustrates a plan view of actuator 30 in accordance with example embodiments of the present disclosure. FIG. 20B illustrates a cross-sectional view of actuator 30 in accordance with example embodiments of the present disclosure. As shown in FIG. 20A, actuator 30 includes outer frame 32 connected to inner frame 34 by one or more flexures or spring elements 33. Further, actuator 30 includes one or more comb drive actuators 20 that apply a controlled force (e.g., an electrostatic force developed from a voltage) between outer frame 32 and inner frame 34.

Embodiments of actuator 30 are suitable for moving a platform (e.g., 45) having electrical connections, for actuator 30 enables precise, controlled, and variable forces to be applied between inner and outer frames 34 and 32 in multiple degrees of freedom (including linear and rotational, for example), and may be implemented using a highly compact footprint. Moreover, actuator 30 may utilize MEMS devices for reduction in power. Accordingly, actuator 30 provides multiple benefits over conventional solutions to optical image stabilization and autofocus applications constrained by size, power, cost, and performance parameters, such as in smartphone and other applications described herein.

Flexures 33 may be electrically conductive and may be soft in all movement degrees of freedom. In various embodiments, Flexures 33 route electrical signals from electrical contact pads on outer frame 32 to electrical contact pads on the inner frame 34. In example implementations, flexures 33 come out from inner frame 34 in one direction, two directions, three directions, or in all four directions.

In one embodiment, actuator 30 is made using MEMS processes such as, for example, photolithography and etching of silicon. In one embodiment, actuator 30 moves +/−150 micrometers in plane, and flexures 33 are designed to tolerate this range of motion without touching one another (e.g., so that separate electrical signals can be routed on the various flexures 33). For example, flexures 33 may be S-shaped flexures ranging from about 1 to 5 micrometers in thickness, about 2 to 20 micrometers wide, and about 150 to 1000 micrometers by about 150 to 1000 micrometers in the plane.

In order for flexures 33 to conduct electricity well with low resistance, flexures 33 may contain, for example, heavily doped polysilicon, silicon, metal (e.g., aluminum), a combination thereof, or other conductive materials, alloys, and the like. For example, flexures 33 may be made out of polysilicon and coated with a roughly 2000 Angstrom thick metal stack of Aluminum, Nickel, and Gold. In one embodiment, some flexures 33 are designed differently from other flexures 33 in order to control the motion between outer frame 32 and inner frame 34. For example, four to eight (or some other number) of flexures 33 may have a device thickness between about 50 and 250 micrometers. Such a thickness may somewhat restrict out-of-plane movement of outer frame 32 with respect to inner frame 34.

In one embodiment, actuator 30 includes central anchor 36, and the one or more comb drives 20 apply a controlled force between inner frame 34 and central anchor 36. In embodiments, one or more comb drive actuators 20 may be attached to central anchor 36, and central anchor 36 may be mechanically fixed with respect to outer frame 32. In one instance, the comb drive actuators are connected to inner frame 34 through flexures 35 that are relatively stiff in the respective comb-drive-actuator direction of motion and relatively soft in the orthogonal direction. This may allow for controlled motion of inner frame 34 with respect to outer frame 32, and thus, more precise positioning.

Figure 22A:
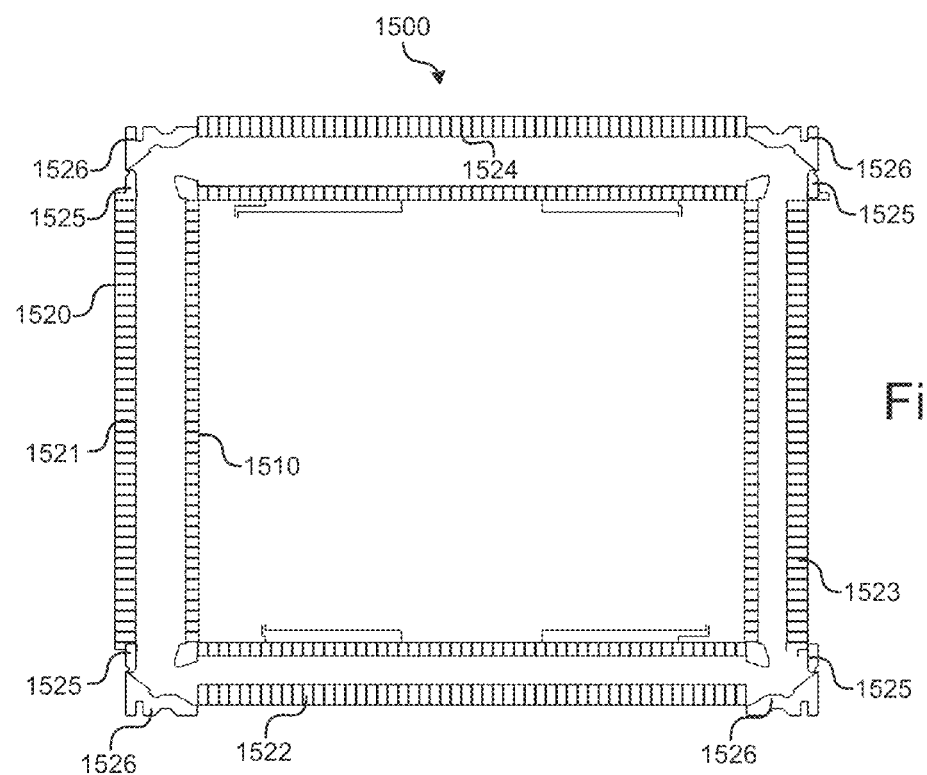
FIG. 22A illustrates an example MEMS actuator with an outer frame including four electrical bars that have not been latched in accordance with the disclosed technology.
Figure 22B:
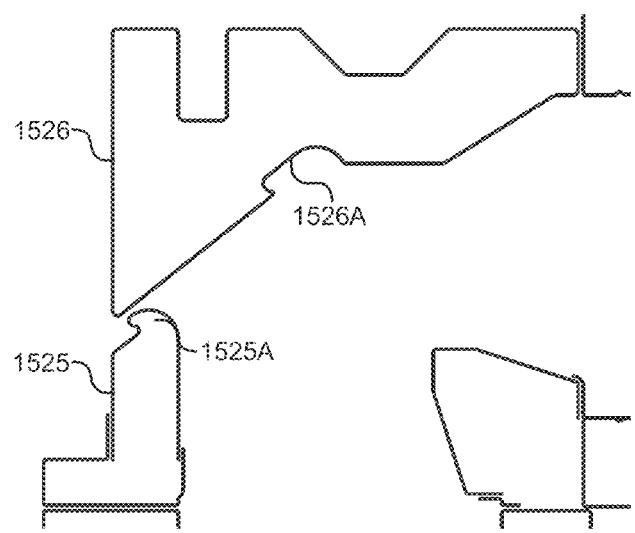
FIG. 22B is a magnified view of the latching mechanisms of the MEMS actuator of FIG. 22A.
Figure 22C:
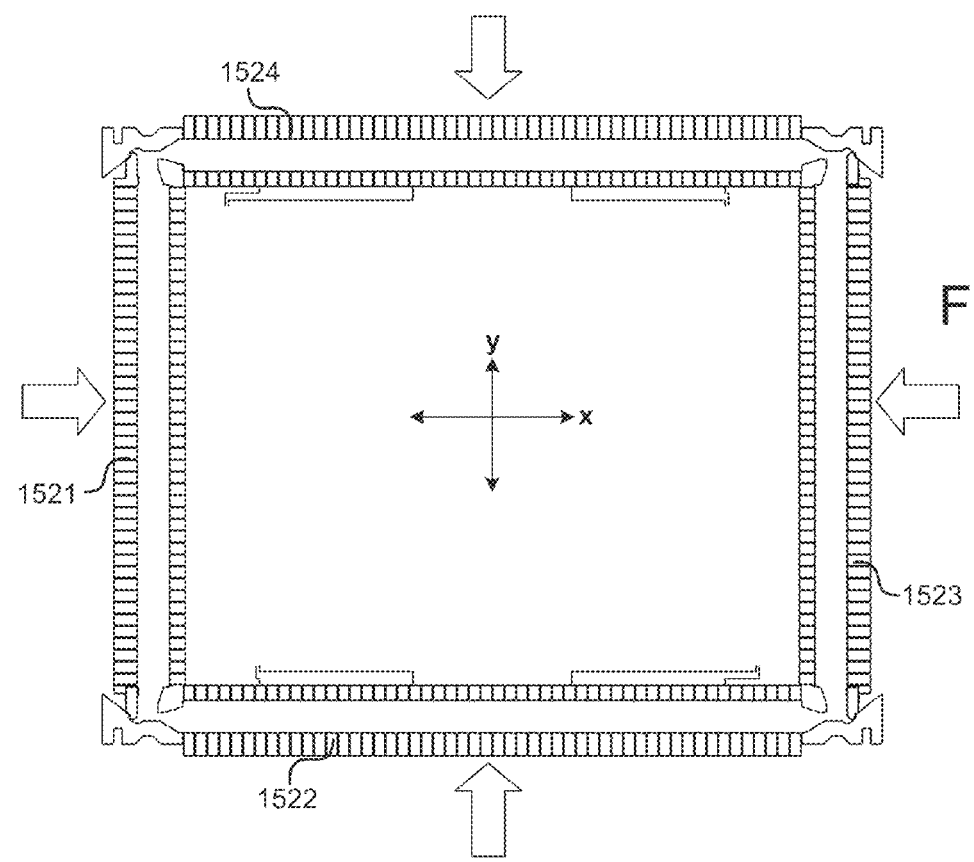
FIG. 22C illustrates the MEMS actuator of FIG. 22A after the electrical bars have been latched.
Figure 22D:
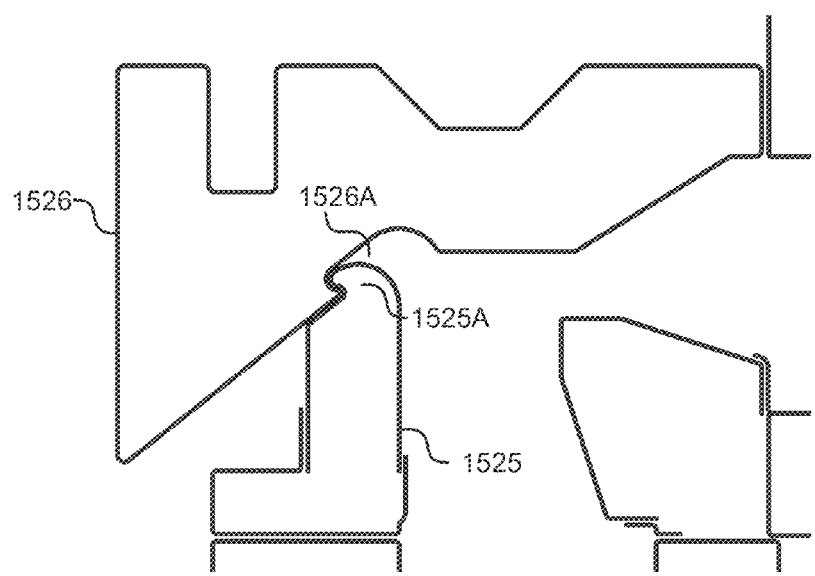
FIG. 22D is a magnified view of the latching mechanisms of the MEMS actuator of FIG. 22C.

Outer frame 32, in some implementations of actuator 30, is not continuous around the perimeter of actuator 30, but is broken into two, three, or more pieces. For example, FIGS. 22C and 22D illustrate plan and cross-sectional views of actuator 30 in accordance with example embodiments of the present disclosure in which outer frame 32 is divided into two sections, and flexures 33 come out in only two directions. Similarly, inner frame 34 may be continuous or may be divided into sections, in various embodiments.

As shown in FIG. 20A, there may be four comb drives total—two comb drives actuate in one direction in the plane of actuator 30, and the other two comb drives actuate in an orthogonal direction in the plane of actuator 30. Various other comb drive actuator 20 arrangements are possible. Such arrangements may include more or less comb drives, and may actuate in more or less degrees of freedom (e.g., in a triangular, pentagonal, hexagonal formation, or the like), as will be appreciated by one of skill in the art upon studying the present disclosure.

In one embodiment, platform 45 is attached to outer frame 32 and to central anchor 36. In this manner, platform 45 may fix outer frame 32 with respect to central anchor 36 (and/or vice versa). Inner frame 34 may then move with respect to both outer frame 32 and central anchor 36, and also with respect to platform 45. In one embodiment, platform 45 is a silicon platform. Platform 45, in various embodiments, is an optoelectronic device, or an image sensor, such as a charge-coupled-device (CCD) or a complementary-metal-oxide-semiconductor (CMOS) image sensor.

Figure 20D:
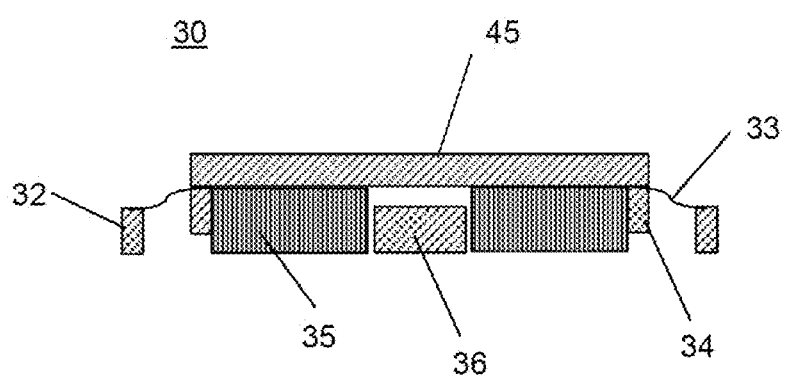
FIG. 20D illustrates a cross-sectional view of an actuator that may use the disclosed flexures in accordance with embodiments of the disclosed technology.

FIG. 20B illustrates that the size of actuator 30 may be substantially the same as the size as platform 45, and platform 45 may attach to outer frame 32 and central anchor 36, thus mechanically fixing central anchor 36 with respect to outer frame 32. In one example implementation, platform 45 is an image sensor with an optical format of 1/3.2". In this implementation, the size of both actuator 30 and platform 45 can be equal to about 6.41 mm by 5.94 mm. As shown in FIG. 20D, in one embodiment of actuator 30, platform 45 is smaller than actuator 30, and platform 45 attaches to inner frame 34. In this particular embodiment, outer frame 32 is fixed relative to inner frame 34, and inner frame 34 is moved by the various comb drive actuators 20.

Figure 21:
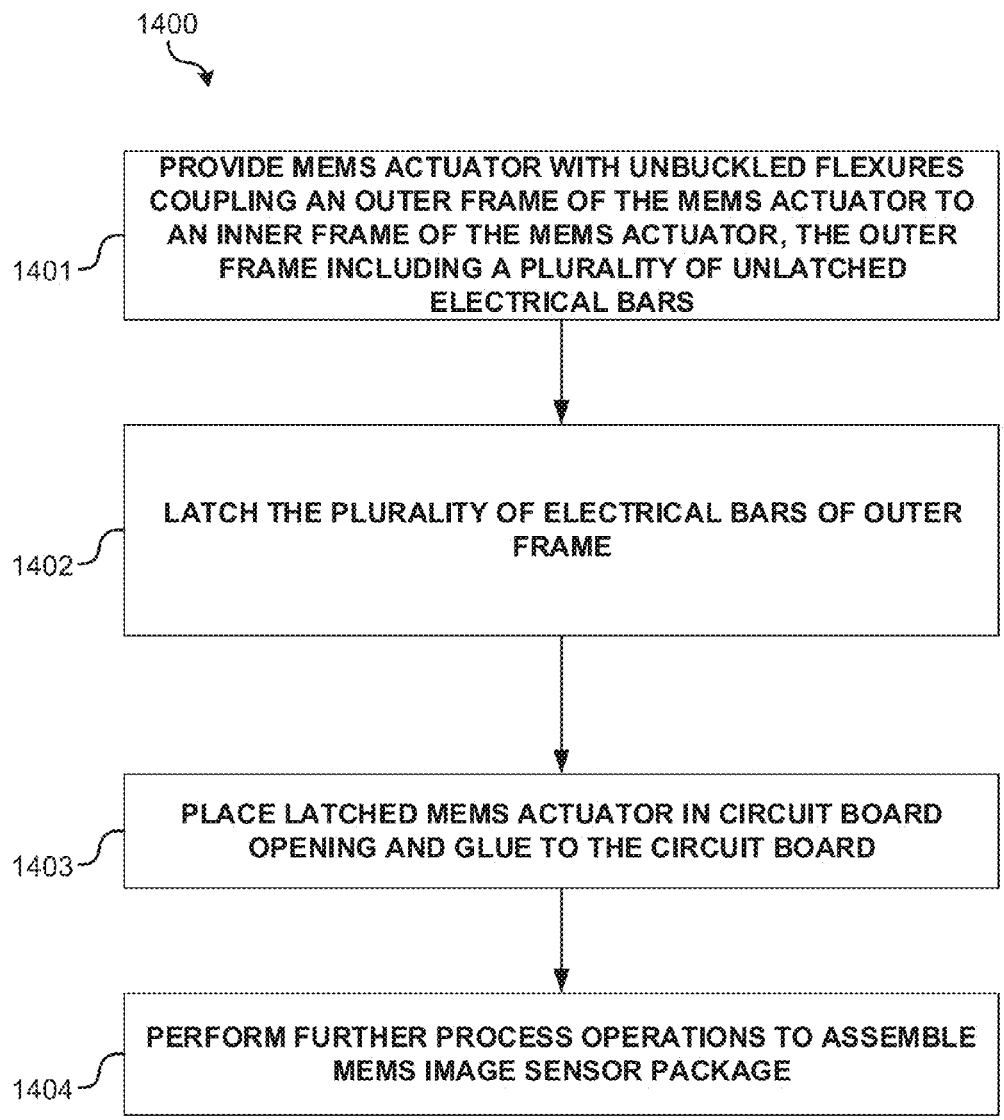
FIG. 21 is an operational flow diagram illustrating a method of assembling a MEMS actuator for an image sensor package by latching electrical bars of an outer frame of the actuator in accordance with the disclosed technology.
Figure 23C:
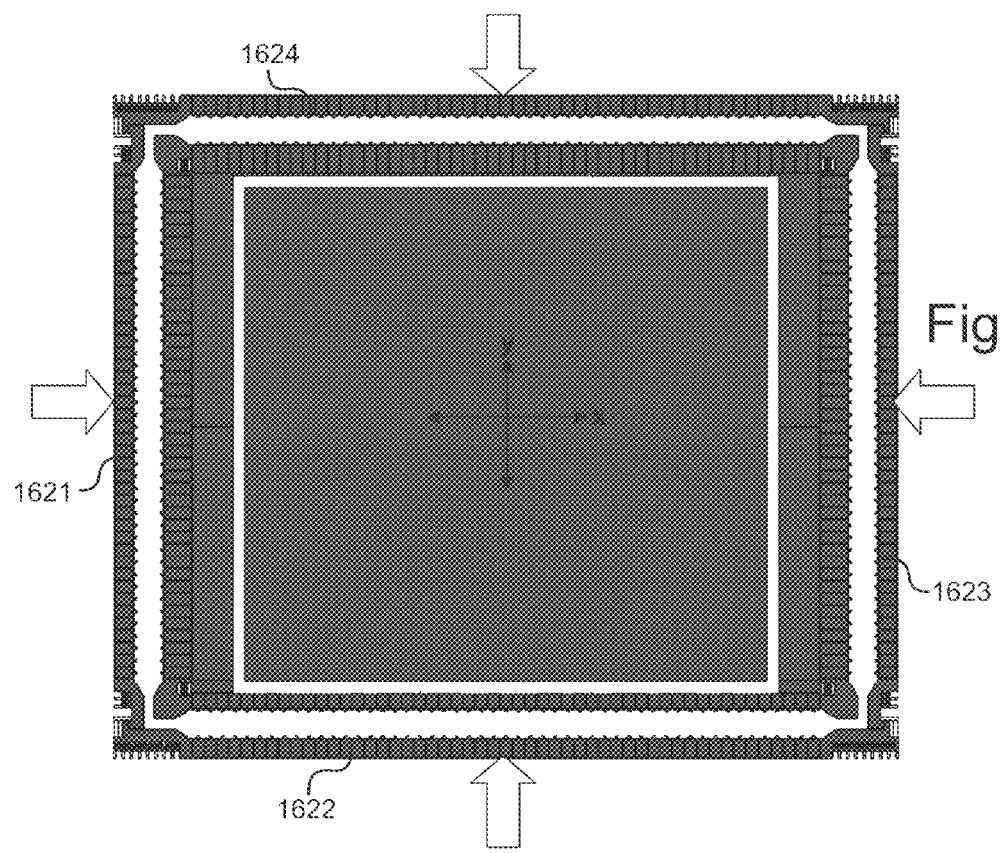
FIG. 23C illustrates the MEMS actuator of FIG. 23A after the electrical bars have been latched.
Figure 23D:
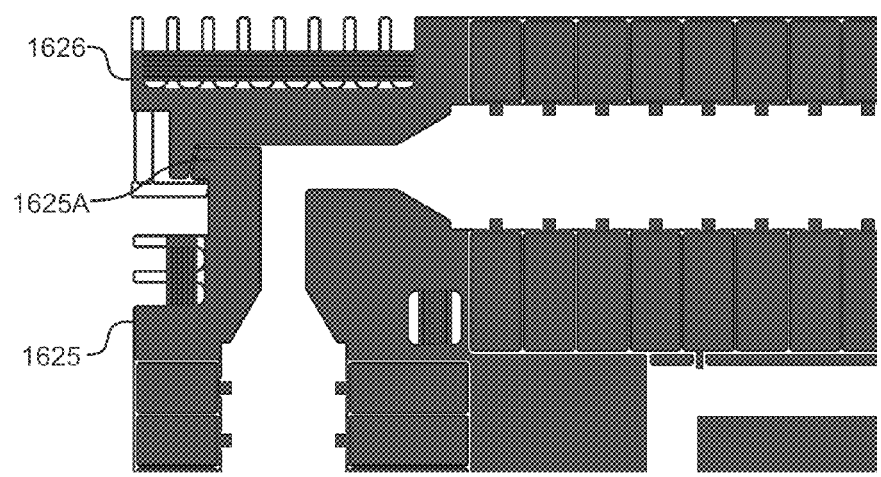
FIG. 23D is a magnified view of the latching mechanisms of the MEMS actuator of FIG. 23C.

FIG. 21 is an operational flow diagram illustrating an exemplary method 1400 of assembling MEMS actuators for image sensor packages (e.g., actuator 30) by latching electrical bars of an outer frame (e.g., frame 32) of the actuator in accordance with an embodiment. In accordance with method 1400, the flexures (e.g., flexures 33) of the actuator are buckled during latching, thereby seamlessly integrating the process of buckling the actuator's flexures into the MEMS actuator assembly process. Although method 1400 is described with reference to assembling an image sensor package, one having skill in the art would appreciate that the method may be implemented for assembling any MEMS actuator with buckled flexures. Method 1400 will be described with reference to FIGS. 22-24, which illustrate exemplary electrical bar latching structures that may be used in latching the outer frame of the MEMS actuator.

With reference now to method 1400, at operation 1401 a MEMS actuator with unbuckled flexures is provided. FIGS. 22A and 22B illustrate one such example actuator 1500. Actuator 1500 comprises an inner frame 1510 coupled to an outer frame 1520 by a plurality of unbuckled flexures (not pictured). Outer frame 1520 includes four electrical bars 1521-1524 that are not latched. In embodiments, an array of unbuckled flexures may couple each of electrical bars 1521-1524 with a corresponding side of inner frame 1510. As illustrated in this particular embodiment, electrical bars 1521 and 1523 each comprise a latching mechanism 1525 at each end of the bar with a respective latch hook or protrusion 1525A Correspondingly, electrical bars 1522 and 1524 each comprise a latching mechanism 1526 at each end of the bar with a respective latch notch or groove 1526A.

Subsequently, at operation 1402 the plurality of electrical bars of the outer frame 1520 are latched together. FIGS. 22C and 22D illustrate actuator 1500 after electrical bars 1521-1524 are latched together. As illustrated, each of the latch protrusions 1525A engage a respective latch groove 1526A, thereby securing the electrical bars 1521-1524 together. During latching, the unbuckled flexures of the MEMS actuator are compressed along an axial direction (e.g., X, Y, or X-Y direction) from the outer frame 1520 to inner frame 1510. During this compression, the plurality of unbuckled flexures enter a buckled state. Accordingly, the latched MEMS actuator includes a plurality of buckled flexures coupling outer frame 1520 to inner frame 1510. In various embodiments, electrical bars 1521 and 1523 may be displaced between 0.2 and 0.4 mm in the X direction, and electrical bars 1522 and 1524 may be displaced between 0.2 and 0.4 mm in the Y direction to latch the electrical bars 1521-1524.

In embodiments, a customized pick-and-place (PnP) machine or tool may be used to latch the electrical bars 1521-1524. For example, the PnP tool may securely clamp or hold the outer frame and produce a force along an axial direction from the outer frame toward the inner frame sufficient to compress the flexures to a buckled state. Additionally, the PnP tool may place the latch protrusions 1525A into corresponding latch grooves 1526A.

As would be appreciated by one having skill in the art, any number of alternative latching mechanisms besides 1525 and 1526 may be used to latch the electrical bars of the outer frame of the MEMS actuator. The size and shape of latch protrusions 1525A and latch grooves 1526A may be tuned in various embodiments to accommodate the design of various electrical bars for the MEMS drives actuator. For example, the shape of the latch protrusions and correspondingly latch grooves may be rectangular, trapezoidal, triangular, or circular. As another example, the width, thickness, and height of the latch protrusions and grooves may be adjusted.

FIGS. 23A-23D illustrates one such example of an alternative latching mechanism implemented in a mems actuator 1600 comprising an inner frame 1610 and outer frame 1620 with four electrical bars 1621-1624. Electrical bars 1621 and 1623 each comprise a latching mechanism 1625 at each end of the bar with a respective latch protrusion 1625A. Correspondingly, electrical bars 1622 and 1624 each comprise a latching mechanism 1626 at each end of the bar with a respective latch groove 1626A. After latching, each of the latch protrusions 1625A engage a respective latch groove 1626A, thereby securing the electrical bars 1621-1624 together. In this particular embodiment, the latch protrusions 1625A are trapezoidal. Further, in this embodiment latching mechanism 1626 is illustrated as comprising two components forming groove 1626A: the L-shaped hook structure 1626B and structure 1626C. Alternatively, in other embodiments latching mechanism 1626 may be one continuous structure (i.e., hook structure 1626B may be combined with structure 1626C).

Figure 24A:
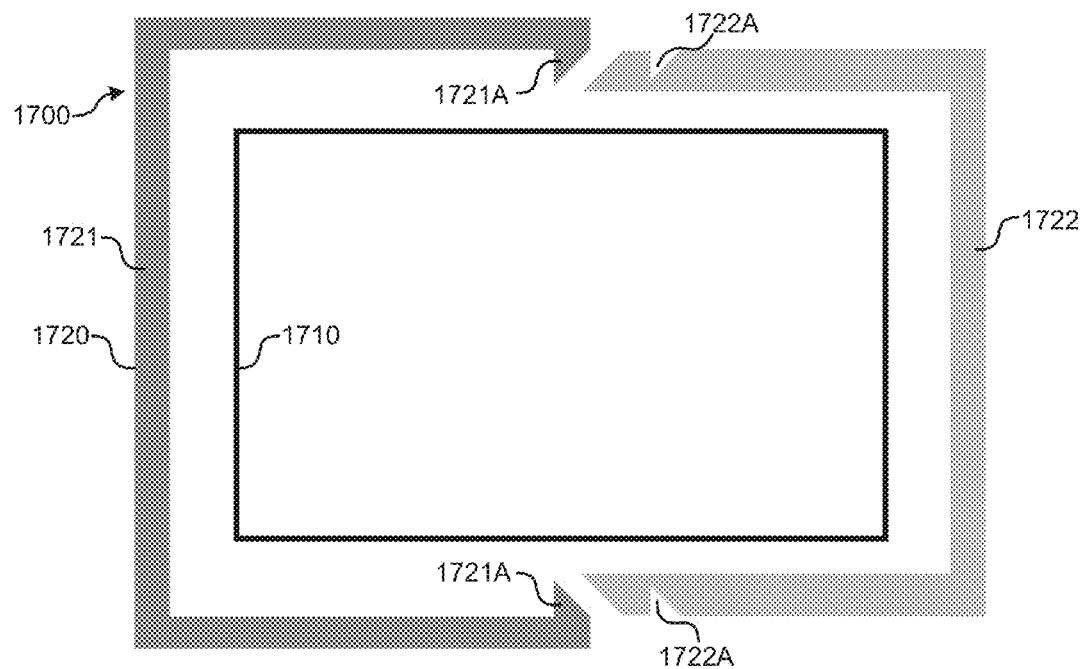
FIG. 24A illustrates an example MEMS actuator including an inner frame and an outer frame with two electrical bars that have not been latched in accordance with the disclosed technology.
Figure 24B:
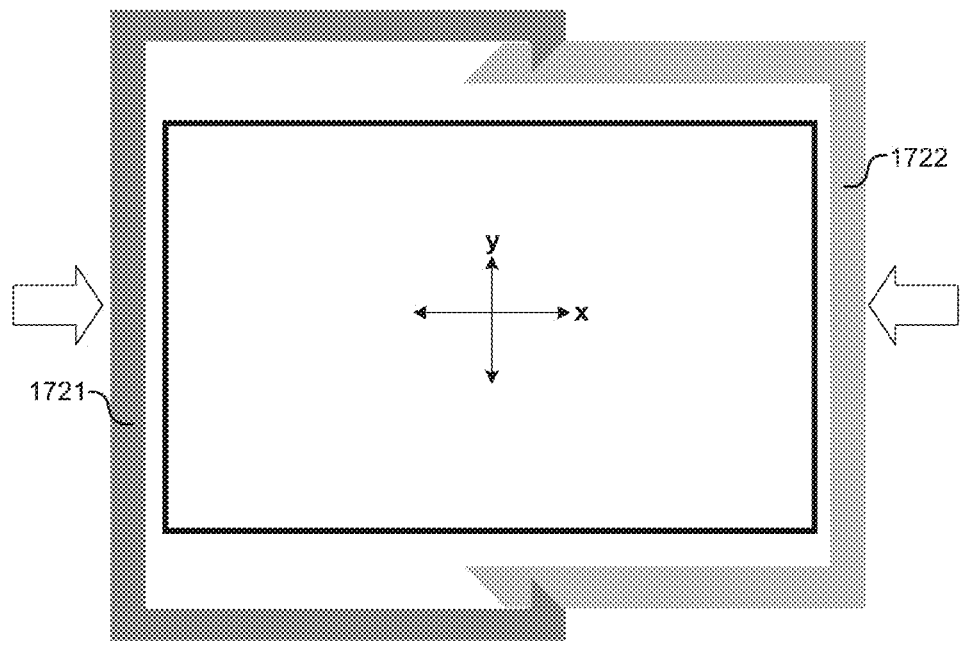
FIG. 24B illustrates the MEMS actuator of FIG. 24A after the electrical bars have been latched.

As would be further appreciated by one having skill in the art, the outer frame of the mems actuator need not be limited to four electrical bars or parts, and may be composed of any number of latching electrical bars (e.g., 2, 3, etc.). For example, FIGS. 24A and 24B illustrate an embodiment of a mems actuator 1700 comprising an inner frame 1710 and outer frame 1720 with two electrical bars 1721-1722. As illustrated in this particular embodiment, electrical bar 1721 comprises a latching mechanism at each end of the bar including a triangular latching protrusion 1721A. Correspondingly, electrical bar 1722 comprises a latching mechanism at each end of the bar including a respective triangular latching groove 1722A. During latching, in this embodiment, the unbuckled flexures of the MEMS actuator are compressed along the X direction from the outer frame 1720 to inner frame 1710.

Figure 25:
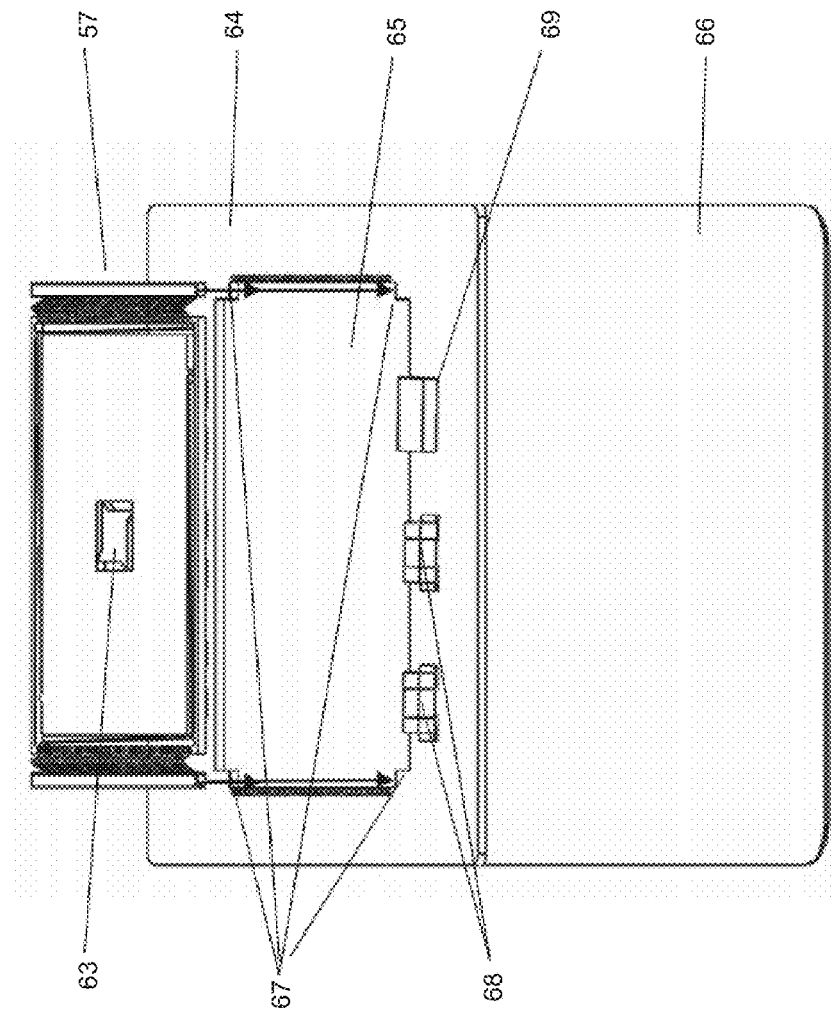
FIG. 25 illustrates an exploded perspective view of an example embodiment of placement of a MEMS actuator in a rigid circuit board in accordance with the technology disclosed herein.

Referring back to method 1400, follow latching of the mems actuator, at operation 1403 the latched MEMS actuator may be placed in a circuit board cutout or opening and the assembly may be glued (e.g., using thermal epoxy) to secure the MEMS actuator and latches to the assembly. FIG. 25 shows an exploded perspective view of an example embodiment of placement of a MEMS actuator 57 in a rigid circuit board 64 mounted on a back plate 66 in accordance with the technology disclosed herein. A customized pick and place machine (PnP) can place the MEMS actuator 57 into the rigid circuit board opening 65 using alignment marks on the rigid circuit board 74. It should be noted that the shape of opening 65 is designed to fit MEMS actuator 57, and may provide in-plane movement limiting features 67 on the corners if needed to improve the in-plane drop performance. The size of opening 65 is adjustable based on the size of the image sensor 70. In various embodiments, the gap between the MEMS actuator 57 and a back plate 66 can be controlled by a section of embedded copper under the anchor 63 of MEMS actuator 57. In embodiments, epoxy between the rigid circuit board 74 and the back plate 66 can flow to the edges of the opening 65 during reflow and this bond line functions to control the gap.

Figure 26:
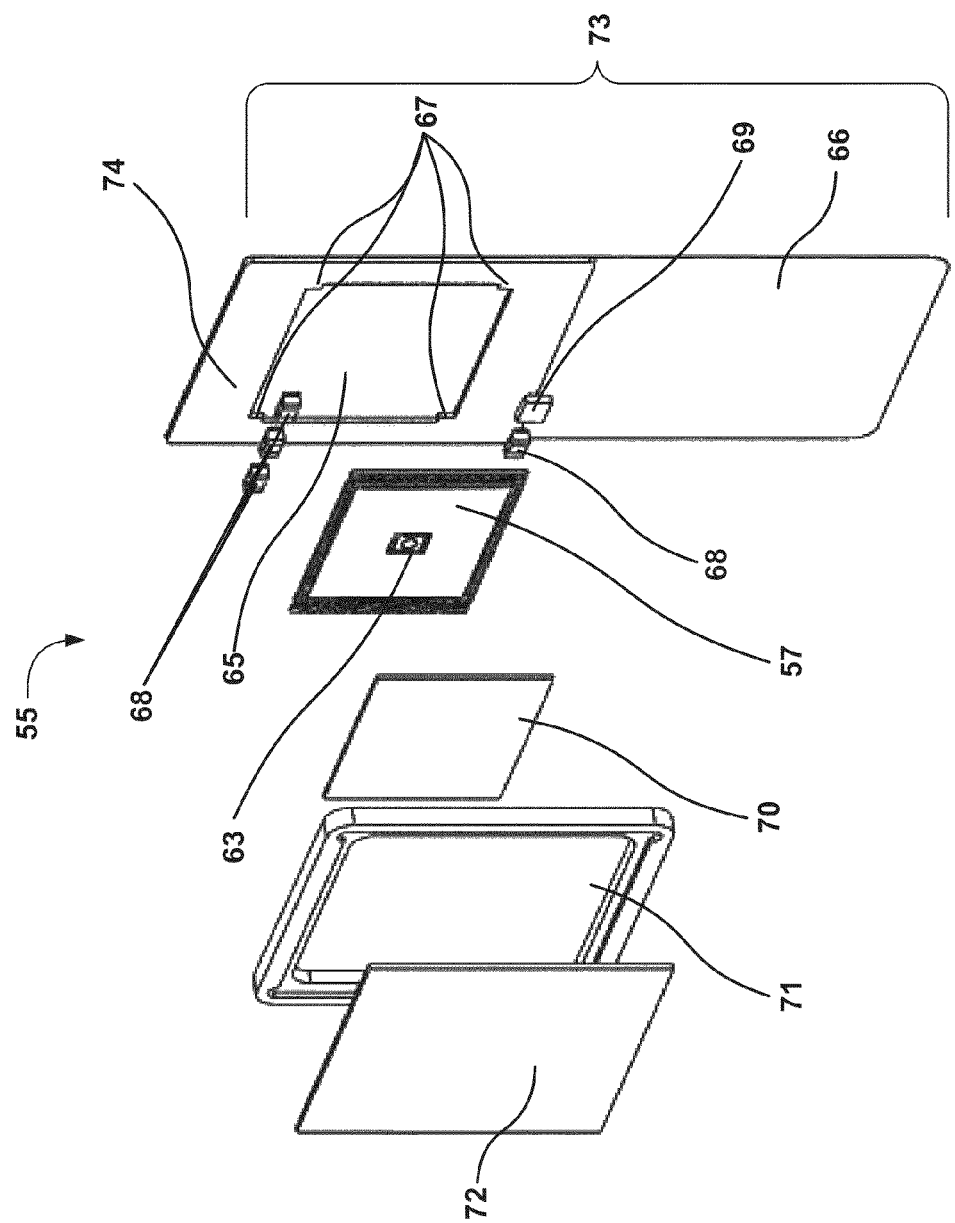
FIG. 26 is an exploded perspective view of an example image sensor package utilized in accordance with various embodiments of the technology disclosed herein.

Subsequently, further process operations 1404 may be performed to assemble the MEMS image sensor package. FIG. 26 is an exploded perspective view illustrating an assembled moving image sensor package 55 that may use the actuator 57 of FIG. 25 in accordance with one embodiment of the technology disclosed herein. Moving image sensor package 55 can include, but is not limited to the following components: a substrate 73; a plurality of capacitors or other passive electrical components 68; a MEMS actuator driver 69; a MEMS actuator 57; an image sensor 70; an image sensor cap 71; and an infrared (IR) cut filter 72. Substrate 73 can include a rigid circuit board 74 with an opening 65 and in-plane movement limiting features 67, and a flexible circuit board acting as a back plate 66. The rigid circuit board 74 may be constructed out of ceramic or composite materials such as those used in the manufacture of plain circuit boards (PCB), or some other appropriate material(s). Moving image sensor package 15 may include one or more drivers 69.

Since the thermal conduction of air is roughly inversely proportional to the gap, and the image sensor 70 can dissipate a substantial amount of power between 100 mW and 1 W, the gaps between the image sensor 30, the stationary portions of the MEMS actuator 57, the moving portions of the MEMS actuator 57, and the back plate 66 are maintained at less than approximately 50 micrometers. In one embodiment, the back plate 66 can be manufactured out of a material with good thermal conduction, such as copper, to further improve the heat sinking of the image sensor 70. In one embodiment, the back plate 66 has a thickness of approximately 50 to 100 micrometers, and the rigid circuit board 74 has a thickness of approximately 150 to 200 micrometers.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A MEMS actuator comprising:
   an inner frame;
   an outer frame comprising a plurality of latched electrical bars, wherein a first of the plurality of latched bars comprises a latch protrusion secured to a corresponding latch groove of a second of the plurality of latched bars; and
   a plurality of buckled flexures coupling the inner frame to the outer frame.

2. The MEMS actuator of claim 1, wherein the plurality of buckled flexures electrically and mechanically couple the inner frame to the outer frame.

3. The MEMS actuator of claim 1, wherein the plurality of latched electrical bars consists of the first and the second latched bars, each of the first and second latched bars coupled to the inner frame by a corresponding plurality of buckled flexures, and wherein the first latched bar comprises a plurality of latch protrusions secured to a corresponding plurality of latch grooves of the second latched bar.

4. The MEMS actuator of claim 1, wherein the plurality of latched electrical bars comprise four latched electrical bars, and wherein each of the four electrical bars is coupled to the inner frame by a corresponding plurality of buckled flexures.

5. The MEMS actuator of claim 4, wherein the first of the plurality of latched electrical bars comprises a second latch protrusion secured to a corresponding latch groove of a third of the plurality of the latched bars.

6. The MEMS actuator of claim 5, wherein the second of the plurality of latched electrical bars comprises a second latch groove secured to a corresponding latch protrusion of a fourth of the plurality of the latched bars.

7. The MEMS actuator of claim 6, wherein the third of the plurality of latched bars comprises a second latch groove secured to a second latch protrusion of the fourth of the plurality of latched bars.

8. The MEMS actuator of claim 1, wherein each of the plurality of flexures includes a first end connected to a first frame, a second end connected to a second frame, and a buckled section connecting the first end to the second end.

9. The MEMS actuator of claim 8, wherein each of the plurality of flexures is 10 to 30 micrometers wide and 1 to 3 micrometers thick.

10. The MEMS actuator of claim 1, wherein the MEMS actuator is mounted in a cutout of a circuit board.

11. An image sensor package, comprising:
    a circuit board;
    a MEMS actuator mounted in a cutout of the circuit board, and comprising:
       an inner frame;
       an outer frame comprising a plurality of latched electrical bars, wherein a first of the plurality of latched bars comprises a latch protrusion secured to a corresponding latch groove of a second of the plurality of latched bars; and
       a plurality of buckled flexures coupling the inner frame to the outer frame; and
    an image sensor mounted on the MEMS actuator.

12. The image sensor package of claim 11, wherein the plurality of latched electrical bars consists of the first and the second latched bars, each of the first and second latched bars coupled to the inner frame by a corresponding plurality of buckled flexures, and wherein the first latched bar comprises a plurality of latch protrusions secured to a corresponding plurality of latch grooves of the second latched bar.

13. The image sensor package of claim 11, wherein the plurality of latched electrical bars comprise four latched electrical bars, and wherein each of the four electrical bars is coupled to the inner frame by a corresponding plurality of buckled flexures.

14. The image sensor package of claim 13, wherein the first of the plurality of latched electrical bars comprises a second latch protrusion secured to a corresponding latch groove of a third of the plurality of the latched bars.

15. The image sensor package of claim 14, wherein the second of the plurality of latched electrical bars comprises a second latch groove secured to a corresponding latch protrusion of a fourth of the plurality of the latched bars.

16. The image sensor package of claim 15, wherein the third of the plurality of latched bars comprises a second latch groove secured to a second latch protrusion of the fourth of the plurality of latched bars.

* * * * *